(12) United States Patent
Hatakeyama et al.

(10) Patent No.: US 11,764,719 B2
(45) Date of Patent: Sep. 19, 2023

(54) DIRECT CURRENT POWER SUPPLY DEVICE, MOTOR DRIVE APPARATUS, BLOWER, COMPRESSOR, AND AIR CONDITIONER

(71) Applicant: Mitsubishi Electric Corporation, Tokyo (JP)

(72) Inventors: Kazunori Hatakeyama, Tokyo (JP); Keisuke Uemura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 120 days.

(21) Appl. No.: 17/617,695

(22) PCT Filed: Aug. 30, 2019

(86) PCT No.: PCT/JP2019/034260
§ 371 (c)(1),
(2) Date: Dec. 9, 2021

(87) PCT Pub. No.: WO2021/038866
PCT Pub. Date: Mar. 4, 2021

(65) Prior Publication Data
US 2022/0255486 A1    Aug. 11, 2022

(51) Int. Cl.
*H02P 27/08* (2006.01)
*H02M 7/219* (2006.01)
(Continued)

(52) U.S. Cl.
CPC ........... *H02P 27/08* (2013.01); *H02M 7/219* (2013.01); *H02M 7/53871* (2013.01);
(Continued)

(58) Field of Classification Search
CPC .......... H02P 27/00; H02P 27/04; H02P 27/06; H02P 27/08; H02P 27/085; H02P 29/00;
(Continued)

(56) References Cited

U.S. PATENT DOCUMENTS

2020/0044457 A1* 2/2020 Miyake .................. H02M 1/36

FOREIGN PATENT DOCUMENTS

JP    H06-217448 A    8/1994
JP    2006184241 A    7/2006
(Continued)

OTHER PUBLICATIONS

International Search Report dated Nov. 19, 2019, issued in corresponding International Patent Application No. PCT/JP2019/034260.

*Primary Examiner* — Antony M Paul
(74) *Attorney, Agent, or Firm* — POSZ LAW GROUP, PLC

(57) ABSTRACT

A direct current power supply device includes: a reactor; a converter connected to an alternating current power supply via the reactor; a smoothing capacitor connected between output terminals of the converter; an inrush current preventing circuit disposed on a charging path from the alternating current power supply to the smoothing capacitor; a current detection unit detecting direct current representing an operating state on an output side of the converter; a current detection unit detecting power supply current representing an operating state on an input side of the converter; and a control unit receiving the direct current and the power supply current and controlling an operation of the converter. The control unit receives a detected value of saturated current from at least one of the direct current and the power supply current when the power supply voltage recovers from a state in which the power supply voltage is reduced.

11 Claims, 11 Drawing Sheets

(51) Int. Cl.
*H02M 7/5387* (2007.01)
*H01L 27/06* (2006.01)

(52) U.S. Cl.
CPC ..... *F25B 2600/021* (2013.01); *F25B 2600/11* (2013.01); *H01L 27/0629* (2013.01)

(58) Field of Classification Search
CPC .... H02P 29/02; H02P 29/024; H02P 29/0241; H02P 29/025; H02P 29/026; H02P 29/027; H02P 29/028; H02P 29/40; H02P 21/00; H02P 21/14; H02P 21/22; H02P 23/00; H02P 23/07; H02P 23/14; H02P 23/26; H02P 25/00; H02P 25/062; H02P 6/28; H02P 11/00; H02P 11/04; H02P 11/06
See application file for complete search history.

(56) References Cited

FOREIGN PATENT DOCUMENTS

| | | |
|---|---|---|
| JP | 2017-055475 A | 3/2017 |
| WO | 2020066034 A1 | 4/2020 |

\* cited by examiner

DIRECT CURRENT POWER SUPPLY DEVICE, MOTOR DRIVE APPARATUS, BLOWER, COMPRESSOR, AND AIR CONDITIONER

CROSS REFERENCE TO RELATED APPLICATION

This application is a U.S. National Stage Application of International Patent No. PCT/JP2019/034260 filed on Aug. 30, 2019, the disclosure of which is incorporated herein by reference.

TECHNICAL FIELD

The present invention relates to a direct current power supply device that converts an alternating current voltage output from an alternating current power supply into a direct current voltage and applies the direct current voltage to a load, a motor drive apparatus that drives a motor being the load, a blower and a compressor each including the motor drive apparatus, and an air conditioner including the blower or the compressor.

BACKGROUND

A direct current power supply device includes a converter that converts an alternating current voltage output from an alternating current power supply into a direct current voltage, and a smoothing capacitor that holds the direct current voltage converted by the converter. In the direct current power supply device, an inrush current that is a large current temporarily flowing when the alternating current power supply is turned on may become a problem.

Patent Literature 1 below discloses a motor drive apparatus and an air conditioner, the motor drive apparatus including a direct current power supply device that includes a protection circuit for protecting circuit elements from an inrush current, has high efficiency, and is capable of preventing or reducing a harmonic current while preventing deterioration of element characteristics and damage to the elements due to the inrush current.

PATENT LITERATURE

Patent Literature 1: Japanese Patent Application Laid-open No. 2017-55475

A typical protection circuit includes an inrush current preventing resistor for preventing an excessive inrush current, and a relay connected in parallel to the inrush current preventing resistor. When the power is turned on, a smoothing capacitor is charged while preventing the inrush current by causing a current to flow through the inrush current preventing resistor. Also, when charging of the smoothing capacitor is completed, both ends of the inrush current preventing resistor are short-circuited using the relay. As a result, the current flows through the protection circuit in a path that does not pass through the inrush current preventing resistor.

The operating voltage of the relay is supplied by a power supply circuit in the direct current power supply device. The voltage of the power supply device is generated using the charging voltage of the smoothing capacitor. The operating voltage of a typical relay is a low voltage of about 5 to 24 V. Therefore, the operating voltage can be generated when the charging voltage of the smoothing capacitor is about 50 V or higher.

In the direct current power supply device described in Patent Literature 1, an instantaneous power failure may occur in an environment where a product is used. In an air conditioner, when a compressor that consumes a large amount of power is in operation, the power is consumed by an inverter that drives the compressor, so that electric charge is hardly stored in the smoothing capacitor. Therefore, the voltage of the smoothing capacitor rapidly decreases when the instantaneous power failure occurs. On the other hand, the voltage of the power supply circuit is maintained by a capacitor in the power supply circuit. Therefore, the voltage can be supplied to the relay, so that the relay continues to be in the operating state and both ends of the inrush current preventing resistor remain short-circuited. When the instantaneous power failure is recovered in this state, a charging current flows through the smoothing capacitor without the inrush current preventing resistor. As a result, an excessive inrush current is generated, and circuit components such as a switching element and a current detection resistor in the motor drive apparatus may deteriorate.

SUMMARY

The present invention has been made in view of the above, and an object of the present invention is to provide a direct current power supply device capable of reliably protecting a circuit component from an excessive inrush current that can be generated at the time of recovery from an instantaneous power failure.

In order to solve the above problem and achieve the object, a direct current power supply device according to the present invention includes: a reactor; a converter including four unidirectional elements that are bridge-connected, the converter being connected to an alternating current power supply via the reactor, and the converter converting a power supply voltage being an alternating current voltage output from the alternating current power supply into a direct current voltage and applying the direct current voltage to a load; a smoothing capacitor connected between output terminals of the converter; and an inrush current preventing circuit disposed on a charging path from the alternating current power supply to the smoothing capacitor. The direct current power supply device further includes a first physical quantity detection unit detecting a first physical quantity representing an operating state on an output side of the converter; and a second physical quantity detection unit detecting a second physical quantity representing an operating state on an input side of the converter. The direct current power supply device further includes a control unit receiving the first and second physical quantities and controlling an operation of the converter; and a control power supply generating an operating voltage for operating the control unit. The control unit receives a saturated physical quantity from at least one of the first and second physical quantity detection units when the power supply voltage recovers from a state in which the power supply voltage is reduced.

The direct current power supply device according to the present invention produces an effect whereby the circuit component can be reliably protected from the excessive inrush current that can be generated at the time of recovery from the instantaneous power failure.

DETAILED DESCRIPTION

A direct current power supply device, a motor drive apparatus, a blower, a compressor, and an air conditioner according to embodiments of the present invention will now be described with reference to the accompanying drawings. Note that the present invention is not limited by the following embodiments. Moreover, an electrical connection will be simply referred to as a "connection" in the following description.

First Embodiment

Figure 1:
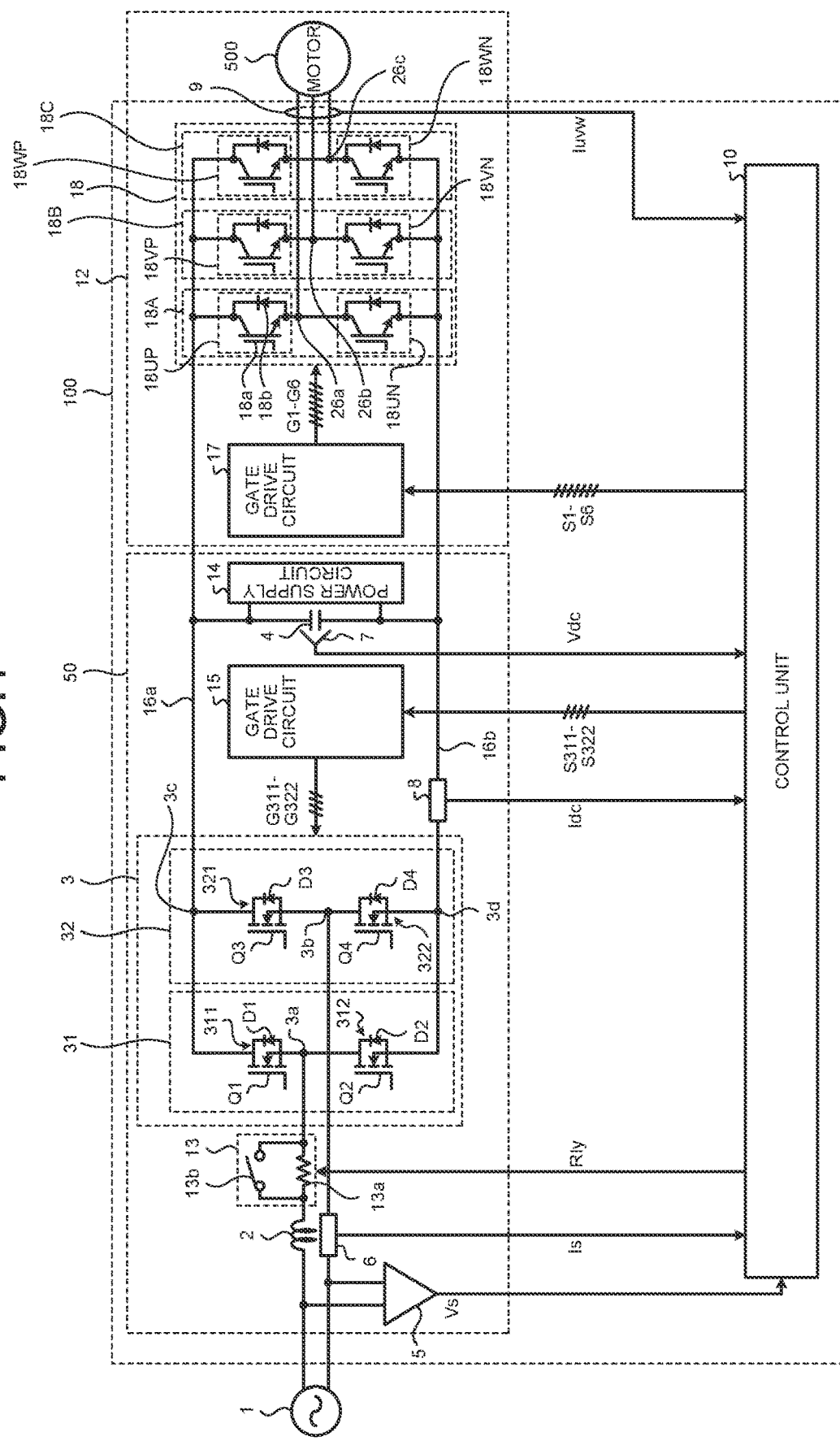
FIG. 1 is a diagram illustrating an example of a configuration of a motor drive apparatus including a direct current power supply device according to a first embodiment.

FIG. 1 is a diagram illustrating an example of a configuration of a motor drive apparatus 100 including a direct current power supply device 50 according to a first embodiment. The direct current power supply device 50 according to the first embodiment is a power supply device that converts a power supply voltage, which is an alternating current voltage output from a single-phase alternating current power supply 1, into a direct current voltage and applies the direct current voltage to a load 12. Also, the motor drive apparatus 100 according to the first embodiment is a drive apparatus that converts direct current power output from the direct current power supply device 50 into alternating current power, and supplies the alternating current power obtained by the conversion to a motor 500 to drive the motor 500.

As illustrated in FIG. 1, the motor drive apparatus 100 according to the first embodiment includes a direct current power supply device 50, a control unit 10, and an inverter 18 as main components.

The direct current power supply device 50 includes a reactor 2, a converter 3, an inrush current preventing circuit 13, a gate drive circuit 15 as a first drive circuit, a smoothing capacitor 4, a voltage detection unit 5, a current detection unit 6, a voltage detection unit 7, a current detection unit 8, and a power supply circuit 14 as a control power supply. One end of the reactor 2 is connected to the alternating current power supply 1, and the other end of the reactor 2 is connected to the converter 3. The reactor 2 temporarily stores the power supplied from the alternating current power supply 1. The converter 3 converts an alternating current voltage output from the alternating current power supply 1 into a direct current voltage, and outputs the direct current voltage to direct current buses 16a and 16b. The direct current buses 16a and 16b are electric wirings that connect the converter 3 and the load 12. A voltage between the direct current bus 16a and the direct current bus 16b is referred to as a "bus voltage".

A load 12 includes a gate drive circuit 17 as a second drive circuit, an inverter 18, a current detection unit 9, and the motor 500. Among the components of the load 12, the gate drive circuit 17, the inverter 18, and the current detection unit 9 excluding the motor 500 are the components of the motor drive apparatus 100. The inverter 18 converts the direct current voltage output from the direct current power supply device 50 into an alternating current voltage to be applied to the motor 500, and outputs the alternating current voltage. An example of an apparatus on which the motor 500 is installed is a blower, a compressor, or an air conditioner.

Note that, although FIG. 1 illustrates the example in which the device connected to the inverter 18 is the motor 500, this is not a limitation. The device connected to the inverter 18 may be any device to which the alternating current power is input, and may be a device other than the motor 500.

The converter 3 includes a first leg 31 and a second leg 32. The first leg 31 and the second leg 32 are connected in parallel. In the first leg 31, a first upper arm element 311 and a first lower arm element 312 are connected in series. In the second leg 32, a second upper arm element 321 and a second lower arm element 322 are connected in series. The other end of the reactor 2 is connected to a connection point 3a between the first upper arm element 311 and the first lower arm element 312 of the first leg 31. A connection point 3b between the second upper arm element 321 and the second lower arm element 322 is connected to the other end of the alternating current power supply 1. In the converter 3, the connection points 3a and 3b form alternating current terminals.

Note that in FIG. 1, the reactor 2 is connected between one end of the alternating current power supply 1 and the connection point 3a, but may be connected between another end of the alternating current power supply 1 and the connection point 3b.

In the converter 3, the side corresponding to the connection points 3a and 3b is referred to as an "alternating current side". Moreover, the alternating current voltage output from the alternating current power supply 1 is referred to as a "power supply voltage", and the cycle of the power supply voltage is referred to as a "power supply cycle".

The first upper arm element 311 includes a switching element Q1 and a diode D1 connected in parallel to the switching element Q1. The first lower arm element 312 includes a switching element Q2 and a diode D2 connected in parallel to the switching element Q2. The second upper arm element 321 includes a switching element Q3 and a diode D3 connected in parallel to the switching element Q3. The second lower arm element 322 includes a switching element Q4 and a diode D4 connected in parallel to the switching element Q4.

The diodes D1 and D4 are unidirectional elements disposed such that a forward current flows when the polarity of the power supply voltage is positive, that is, when the side connected to the reactor 2 has a higher potential than the side not connected to the reactor 2. The diodes D2 and D3 are unidirectional elements disposed such that a forward current flows when the polarity of the power supply voltage is negative, that is, when the side not connected to the reactor 2 has a higher potential than the side connected to the reactor 2.

Note that although FIG. 1 discloses the configuration in which the switching elements Q1, Q2, Q3, and Q4 are connected in parallel to the diodes D1, D2, D3, and D4, respectively, the configuration is not limited thereto. It is sufficient if a switching element is connected to each of the two diodes connected to the positive side of the smoothing capacitor 4, that is, the diode D1 in the first leg 31 and the diode D3 in the second leg 32. Alternatively, it is sufficient if a switching element is connected to each of the two diodes connected to the negative side of the smoothing capacitor 4, that is, the diode D2 in the first leg 31 and the diode D4 in the second leg 32. Yet alternatively, it is sufficient if a switching element is connected to each of the two diodes in the first leg 31, that is, the diodes D1 and D2. Still alternatively, it is sufficient if a switching element is connected to each of the two diodes in the second leg 32, that is, the diodes D3 and D4.

Moreover, FIG. 1 illustrates the MOSFET for each of the switching elements Q1, Q2, Q3, and Q4 as an example, but the switching elements are not limited to the MOSFET. The MOSFET is a switching element capable of causing a current to flow bidirectionally between a drain and a source. Any switching element may be used as long as it is a switching element capable of causing a current to flow bidirectionally between a first terminal corresponding to the drain and a second terminal corresponding to the source, that is, a bidirectional element.

Moreover, "parallel" in this case means that the first terminal corresponding to the drain of the MOSFET and a cathode of the diode are connected, and the second terminal corresponding to the source of the MOSFET and an anode of the diode are connected. Note that a parasitic diode included in the MOSFET itself may be used as the diode. The parasitic diode is also referred to as a body diode.

Moreover, the switching elements Q1, Q2, Q3, and Q4 are not limited to a MOSFET formed of a silicon-based material, and may be a MOSFET formed of a wide band gap (WBG) semiconductor such as silicon carbide (Sic), gallium nitride (GaN), gallium oxide ($Ga_2O_3$), or diamond.

The WBG semiconductor generally has higher withstand voltage and heat resistance than the silicon semiconductor. Therefore, the use of the WBG semiconductor for at least one of the switching elements Q1, Q2, Q3, and Q4 increases the withstand voltage and the allowable current density of the switching element, and a semiconductor module incorporating the switching element can be downsized.

Alternatively, as the switching elements Q1, Q2, Q3, and Q4, a MOSFET having a super junction (SJ) structure may be used instead of the WBG semiconductor. The use of the SJ-MOSFET can avoid a disadvantage of the WBG semiconductor that the capacitance is high and recovery is likely to occur while making use of low on-resistance which is an advantage of the SJ-MOSFET.

The description refers back to FIG. 1. The positive side of the smoothing capacitor 4 is connected to the direct current bus 16a on the high potential side. The direct current bus 16a is drawn from a connection point 3c between the first upper arm element 311 in the first leg 31 and the second upper arm element 321 in the second leg 32. The negative side of the smoothing capacitor 4 is connected to the direct current bus 16b on the low potential side. The direct current bus 16b is drawn from a connection point 3d between the first lower arm element 312 in the first leg 31 and the second lower arm element 322 in the second leg 32. In the converter 3, the connection points 3c and 3d form direct current terminals. Also in the converter 3, the side corresponding to the connection points 3c and 3d is referred to as a "direct current side" in some cases.

The output voltage of the converter 3 is applied across the smoothing capacitor 4. The smoothing capacitor 4 is connected to the direct current buses 16a and 16b. The smoothing capacitor 4 smooths the output voltage of the converter 3. The voltage smoothed by the smoothing capacitor 4 is applied to the inverter 18.

The voltage detection unit 5 detects the power supply voltage, and outputs a detected value Vs of the power supply voltage to the control unit 10. The power supply voltage is an absolute value of an instantaneous voltage of the alternating current power supply 1. Note that the power supply voltage may be a root mean square value of the instantaneous voltage.

The current detection unit 6 detects a power supply current that is an alternating current flowing between the alternating current power supply 1 and the converter 3, and outputs a detected value Is of the power supply current to the control unit 10. An example of a current detector used for the current detection unit 6 is an alternating current current transformer (ACCT). The voltage detection unit 7 detects the bus voltage and outputs a detected value Vdc of the bus voltage to the control unit 10.

The current detection unit 8 is disposed on the direct current bus 16b between the converter 3 and the smoothing capacitor 4. The current detection unit 8 detects a direct current flowing through the direct current bus 16b and outputs a detected value Idc of the direct current to the control unit 10. An example of a detector used for the current detection unit 8 is a shunt resistor or a direct current current transformer (DCCT). Moreover, in FIG. 1, the current detection unit 8 is disposed on direct current bus 16b but may be disposed on the direct current bus 16a.

Note that current information used for controlling the operation of the converter 3 may be any one of the detected value Is of the power supply current and the detected value Idc of the direct current. That is, it is sufficient if at least one of the current detection units 6 and 8 is included. However, the current detected by the current detection unit 8 is the direct current, and does not have polarity information unlike the power supply current detected by the current detection unit 6. Therefore, the power supply current may be estimated from the detected value Idc of the direct current using information on the power supply voltage polarity. The information on the power supply voltage polarity can be obtained from the detected value Vs of the power supply voltage. With such a control configuration, the current detection unit 6 can be omitted. In particular, a current does not flow in the current detection unit 6 during a period in which the smoothing capacitor 4 is not charged, so that, when an inexpensive ACCT is used, a detected current value is distorted. An expensive ACCT is thus required. Therefore, the configuration not using the current detection unit 6 leads to cost reduction of the direct current power supply device 50. Note that it goes without saying that both the current detection units 6 and 8 may be included. Including both the current detection units 6 and 8 can improve current detection performance.

Moreover, as described above, the DCCT or the shunt resistor is used for the detector of the current detection unit 8. In recent years, the shunt resistor is often introduced for the purpose of detecting a backflow of the smoothing capacitor or detecting a short-circuit failure of the switching element. The resistance value of the resistor generally has good frequency characteristics. Therefore, the use of the shunt resistor enables detection of the current in a wide frequency range. Also, an existing shunt resistor can be used. In addition, the DCCT with good frequency characteristics is expensive. Therefore, the use of the shunt resistor leads to cost reduction of the direct current power supply device 50. Note that, in the case of omitting the current detection unit 6 and using only the current detection unit 8, the charging current to the smoothing capacitor 4 can be obtained using the information on the power supply voltage polarity obtained from the detected value Vs of the power supply voltage.

The direct current flowing through the direct current bus 16a or the direct current bus 16b is a physical quantity representing an operating state on the direct current side of the converter 3, that is, the output side thereof. Moreover, the power supply current or the power supply voltage is a physical quantity representing an operating state on the alternating current side of the converter 3, that is, the input side thereof. Note that in order to distinguish these physical quantities, the direct current may be referred to as a "first physical quantity", and the power supply current or the power supply voltage may be referred to as a "second physical quantity". Also, the current detection unit 8 that detects the direct current may be referred to as a "first physical quantity detection unit", and the current detection unit 6 that detects the power supply current or the voltage detection unit 5 that detects the power supply voltage may be referred to as a "second physical quantity detection unit".

The inrush current preventing circuit 13 is disposed on a charging path from the alternating current power supply 1 to the smoothing capacitor 4. The inrush current preventing circuit 13 includes an inrush current preventing resistor 13a and a relay 13b. When the alternating current power supply 1 is turned on, the relay 13b is opened so that the current flows through the inrush current preventing resistor 13a. Therefore, when the alternating current power supply 1 is turned on, the charging current to the smoothing capacitor 4 flows through the inrush current preventing resistor 13a. As a result, an inrush current at the time of applying the power supply voltage is prevented, and the circuit components can be protected. On the other hand, the relay 13b operates after the alternating current power supply 1 is turned on. When the relay 13b operates, the power supply current supplied from the alternating current power supply 1 flows through the relay 13b without passing through the inrush current preventing resistor 13a. As a result, Joule loss in the inrush current preventing resistor 13a is reduced, and highly efficient operation can be performed.

The power supply circuit 14 is connected across the smoothing capacitor 4. The power supply circuit 14 uses the voltage of the smoothing capacitor 4 to generate a low-voltage direct current voltage of 5 V, 12 V, 15 V, or 24 V. The low-voltage direct current voltage is generated by using the electric charge accumulated in the smoothing capacitor 4. The low-voltage direct current voltage is applied as an operating voltage to each unit of the supply destination. The power supply circuit 14 outputs, for example, the direct current voltage of 5 V to the control unit 10, the current detection units 6 and 8, and the like. In the control unit 10, the direct current voltage of 5 V is applied to a processor not illustrated in FIG. 1. Moreover, the power supply circuit 14 outputs, for example, the direct current voltage of 12 V to the inrush current preventing circuit 13 as a drive voltage for operating the relay 13b. The control unit 10 outputs an operation signal Rly for operating the relay 13b. The inrush current preventing circuit 13 opens and closes the relay 13b on the basis of the operation signal Rly and the drive voltage.

The inverter 18 includes a leg 18A in which an upper arm element 18UP and a lower arm element 18UN are connected in series, a leg 18B in which an upper arm element 18VP and a lower arm element 18VN are connected in series, and a leg 18C in which an upper arm element 18WP and a lower arm element 18WN are connected in series. The legs 18A, 18B, and 18C are connected in parallel to one another.

FIG. 1 illustrates a case where the upper arm elements 18UP, 18VP, and 18WP and the lower arm elements 18UN, 18VN, and 18WN are insulated gate bipolar transistors (IGBTs) as an example, but this is not a limitation. Instead of the IGBT, a MOSFET or an integrated gate commutated thyristor (IGCT) may be used.

The upper arm element 18UP includes a transistor 18a and a diode 18b connected in parallel to the transistor 18a. The other upper arm elements 18VP and 18WP and the lower arm elements 18UN, 18VN, and 18WN each have a similar configuration. The term "parallel" in this case means that the anode side of the diode is connected to a first terminal corresponding to the emitter of the IGBT, and the cathode side of the diode is connected to a second terminal corresponding to the collector of the IGBT.

Note that FIG. 1 illustrates the configuration including the three legs in each of which the upper arm element and the lower arm element are connected in series, but this configuration is not a limitation. The number of legs may be four or more. Moreover, the circuit configuration illustrated in FIG. 1 is adapted to the motor 500 that is a three-phase motor. In a case where the motor 500 is a single-phase motor, the inverter 18 also has a configuration corresponding to the single-phase motor. Specifically, the inverter has a configuration including two legs in each of which the upper arm element and the lower arm element are connected in series. Note that in either case where the motor 500 is a single-phase motor or a three-phase motor, one leg may include a plurality of pairs of upper and lower arm elements.

When the transistors 18a of the upper arm elements 18UP, 18VP, and 18WP and the lower arm elements 18UN, 18VN, and 18WN are MOSFETs, the upper arm elements 18UP, 18VP, and 18WP and the lower arm elements 18UN, 18VN, and 18WN may be formed of a WBG semiconductor such as silicon carbide, a gallium nitride-based material, or diamond. When the MOSFET formed of the WBG semiconductor is used, the effects of withstand voltage and heat resistance can be obtained.

A connection point 26a between the upper arm element 18UP and the lower arm element 18UN is connected to a first phase (for example, a U phase) of the motor 500, a connection point 26b between the upper arm element 18VP and the lower arm element 18VN is connected to a second phase (for example, a V phase) of the motor 500, and a connection point 26c between the upper arm element 18WP and the lower arm element 18WN is connected to a third phase (for example, a W phase) of the motor 500. In the inverter 18, the connection points 26a, 26b, and 26c form alternating current terminals.

The current detection unit 9 detects a motor current flowing between the inverter 18 and the motor 500, and outputs a detected value Iuvw of the motor current to the control unit 10.

The control unit 10 generates control signals S311 to S322 for controlling the corresponding switching elements in the converter 3 on the basis of the detected value Vs of the voltage detection unit 5, the detected value Is of the current detection unit 6, the detected value Vdc of the voltage detection unit 7, and the detected value Idc of the current detection unit 8. The control signal S311 is a control signal for controlling the switching element Q1, and the control signal S322 is a control signal for controlling the switching element Q4. The switching elements Q2 and Q3 are also controlled by the control signals from the control unit 10. Hereinafter, the operation of the arm elements according to the control signals S311 to S322 is referred to as a "switching operation" as appropriate. The control signals S311 to S322 generated by the control unit 10 are input to the gate drive circuit 15.

Moreover, on the basis of the detected value Vdc of the voltage detection unit 7 and the detected value Iuvw of the current detection unit 9, the control unit 10 generates control signals S1 to S6 for controlling the corresponding switching elements included in the inverter 18 such that the motor 500 rotates at a desired rotational speed. The inverter 18 has the three-phase circuit configuration, and has six switching elements corresponding to the three-phase circuit configuration. Also, the six control signals S1 to S6 are generated corresponding to the six switching elements. The control signals S1 to S6 generated by the control unit 10 are input to the gate drive circuit 17.

The gate drive circuit 15 generates drive pulses G311 to G322 for driving the switching elements in the converter 3 on the basis of the control signals S311 to S322. The drive pulse G311 is a drive pulse for driving the switching element Q1, and the drive pulse G322 is a drive pulse for driving the switching element Q4. The switching elements Q2 and Q3 are also driven by the drive pulses from the gate drive circuit 15.

The gate drive circuit 17 generates drive pulses G1 to G6 for driving the switching elements in the inverter 18 on the basis of the control signals S1 to S6.

Note that in FIG. 1, the control unit 10 is provided inside the motor drive apparatus 100 as a common control unit that controls the direct current power supply device 50 and the load 12, but this configuration is not a limitation. Individual control units that control corresponding ones of the direct current power supply device 50 and the load 12 may be formed and provided inside the corresponding ones of the direct current power supply device 50 and the load 12.

Figure 2:
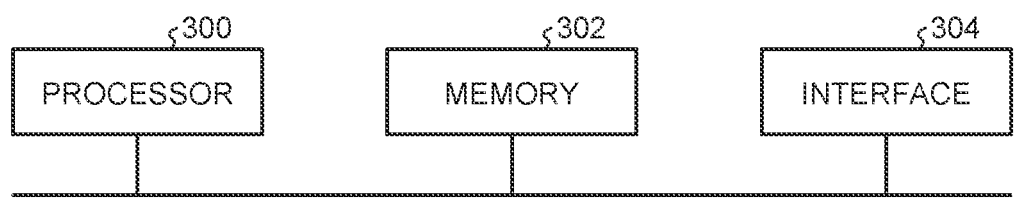
FIG. 2 is a block diagram illustrating an example of a hardware configuration that implements the function of a control unit in the first embodiment.
Figure 3:
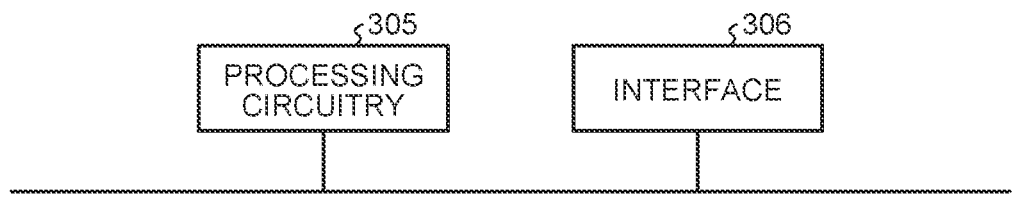
FIG. 3 is a block diagram illustrating another example of the hardware configuration that implements the function of the control unit in the first embodiment.

Next, a hardware configuration for implementing the functions of the control unit 10 in the first embodiment will be described. FIG. 2 is a block diagram illustrating an example of the hardware configuration that implements the functions of the control unit 10 in the first embodiment. FIG. 3 is a block diagram illustrating another example of the hardware configuration that implements the functions of the control unit 10 in the first embodiment.

When the functions of the control unit 10 in the first embodiment are implemented, as illustrated in FIG. 2, a processor 300 that performs an arithmetic operation, a memory 302 that saves programs to be read by the processor 300, and an interface 304 that inputs and outputs signals can be included.

The processor 300 may be arithmetic means such as an arithmetic unit, a microprocessor, a microcomputer, a central processing unit (CPU), or a digital signal processor (DSP). Examples of the memory 302 can include a non-volatile or volatile semiconductor memory such as a random access memory (RAM), a read only memory (ROM), a flash memory, an erasable programmable ROM (EPROM), or an electrically EPROM (EEPROM (registered trademark)), a magnetic disk, a flexible disk, an optical disk, a compact disc, a mini disc, and a digital versatile disc (DVD).

The memory 302 stores programs for executing the functions of the control unit 10 described later. The processor 300 transmits and receives necessary information via the interface 304, executes the programs stored in the memory 302, and refers to a table stored in the memory 302, thereby being able to perform the processing described above. A result of arithmetic operation by the processor 300 can be stored in the memory 302.

Moreover, when the functions of the control unit 10 are implemented, processing circuitry 305 illustrated in FIG. 3 can also be used. The processing circuitry 305 corresponds to a single circuit, a complex circuit, an application specific integrated circuit (ASIC), a field programmable gate array (FPGA), or a combination of those. Information to be input to the processing circuitry 305 and information to be output from the processing circuitry 305 can be obtained via an interface 306. Note that even in the configuration using the processing circuitry 305, some processing in the control unit 10 may be performed by the processor 300 in the configuration illustrated in FIG. 2.

Next, a basic operation of the motor drive apparatus 100 according to the first embodiment will be described. First, in the first leg 31, the first upper arm element 311 and the first lower arm element 312 operate so as not to be complementarily or simultaneously turned on. That is, when one of the first upper arm element 311 and the first lower arm element 312 is on, the other is off. As described above, the first upper arm element 311 and the first lower arm element 312 are controlled by the control signals S311 and S312 generated by the control unit 10. An example of the control signals S311 and S312 is a pulse width modulation (PWM) signal.

In order to prevent a short circuit of the smoothing capacitor 4 via the alternating current power supply 1 and the reactor 2, both the first upper arm element 311 and the first lower arm element 312 are turned off when an absolute value of the detected value Is of the power supply current output from the alternating current power supply 1 is less than or equal to a current threshold. Hereinafter, the short circuit of the smoothing capacitor 4 is referred to as a "capacitor short circuit". The capacitor short circuit is a state in which the energy stored in the smoothing capacitor 4 is released so that the current is regenerated to the alternating current power supply 1.

As described above, the second upper arm element 321 and the second lower arm element 322 included in the second leg 32 are controlled by the control signals S321 and S322 generated by the control unit 10. The second upper arm element 321 and the second lower arm element 322 are basically turned on or off according to the power supply voltage polarity that is the polarity of the power supply voltage. Specifically, when the power supply voltage polarity is positive, the second lower arm element 322 is on, and the second upper arm element 321 is off. When the power supply voltage polarity is negative, the second upper arm element 321 is on, and the second lower arm element 322 is off.

Next, a relationship between a state of each arm element of the converter 3 in the first embodiment and a path of the current flowing through the motor drive apparatus 100 according to the first embodiment will be described. Note that the following description assumes that each arm element of the converter 3 is a MOSFET, and the diode of each arm element is a parasitic diode included in the MOSFET itself.

Figure 4:
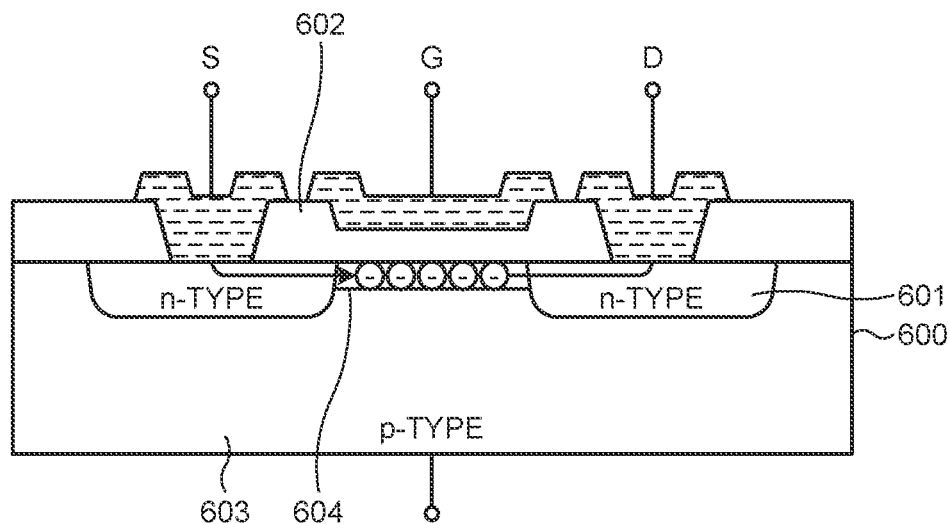
FIG. 4 is a schematic cross-sectional view illustrating a schematic structure of a metal oxide semiconductor field effect transistor (MOSFET) used in a converter of the first embodiment.

First, a structure of the MOSFET will be described with reference to FIG. 4. FIG. 4 is a schematic cross-sectional view illustrating a schematic structure of the MOSFET used in the converter 3 of the first embodiment. FIG. 4 illustrates an n-type MOSFET as an example.

In the case of the n-type MOSFET, a p-type semiconductor substrate 600 is used as illustrated in FIG. 4. A source electrode S, a drain electrode D, and a gate electrode G are formed on the semiconductor substrate 600. Portions in contact with the source electrode S and the drain electrode D are subjected to ion implantation of high-concentration impurities to form n-type regions 601. Moreover, an oxide insulating film 602 is formed between a portion where the n-type region 601 is not formed in the semiconductor substrate 600 and the gate electrode G. That is, the oxide insulating film 602 is interposed between the gate electrode G and a p-type region 603 in the semiconductor substrate 600.

When a positive voltage is applied to the gate electrode G, electrons are attracted to a boundary surface between the p-type region 603 in the semiconductor substrate 600 and the oxide insulating film 602, and the boundary surface is negatively charged. The place where the electrons are gathered has the electron density higher than the hole density and becomes n-type. This n-type portion serves as a current path and is called a channel 604. The channel 604 is an n-type channel in the example of FIG. 4. When the MOSFET is controlled to be turned on, the current flows through the channel 604 more than the parasitic diode formed in the p-type region 603.

Figure 5:
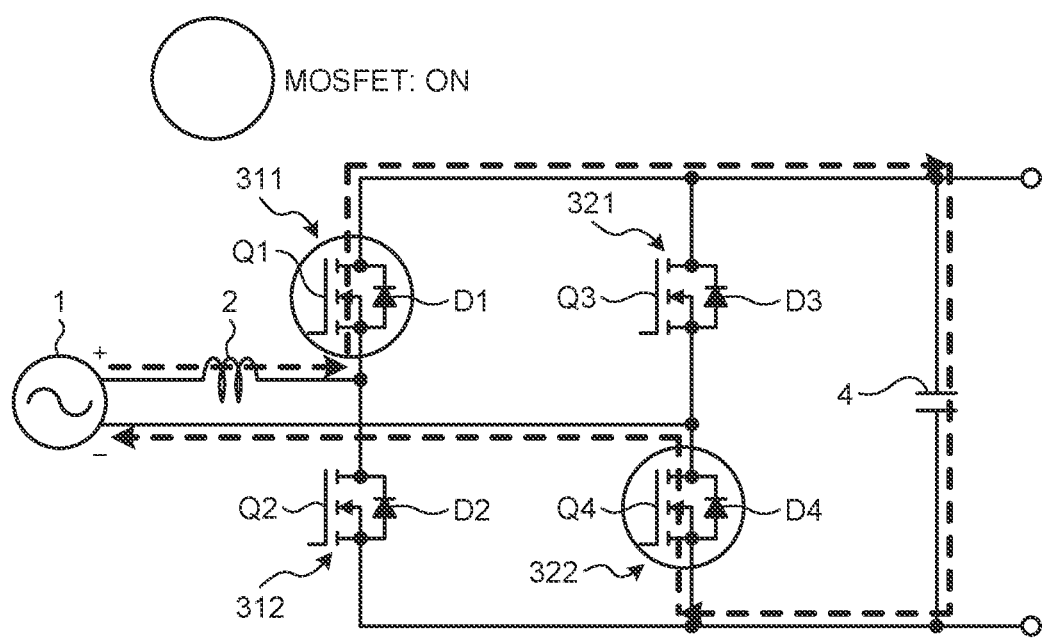
FIG. 5 is a first diagram illustrating a path of a current flowing through the converter in the first embodiment.

FIG. 5 is a first diagram illustrating a path of the current flowing through the converter 3 in the first embodiment. FIG. 5 illustrates a state in which the power supply voltage polarity is positive, and the absolute value of the detected value Is of the power supply current is larger than the current threshold. In this state, the first upper arm element 311 and the second lower arm element 322 are on, and the first lower arm element 312 and the second upper arm element 321 are off. At this time, the current flows through the alternating current power supply 1, the reactor 2, the switching element Q1, the smoothing capacitor 4, the switching element Q4, and the alternating current power supply 1 in this order. As described above, the first embodiment includes an operation mode in which the current is not caused to flow through the diode D1 and the diode D4, but is caused to flow through the channel of each of the switching elements Q1 and Q4. This operation is called "synchronous rectification". Note that in FIG. 5, the MOSFET that is on is indicated by a circle. Similar indication applies to the subsequent drawings as well.

Figure 6:
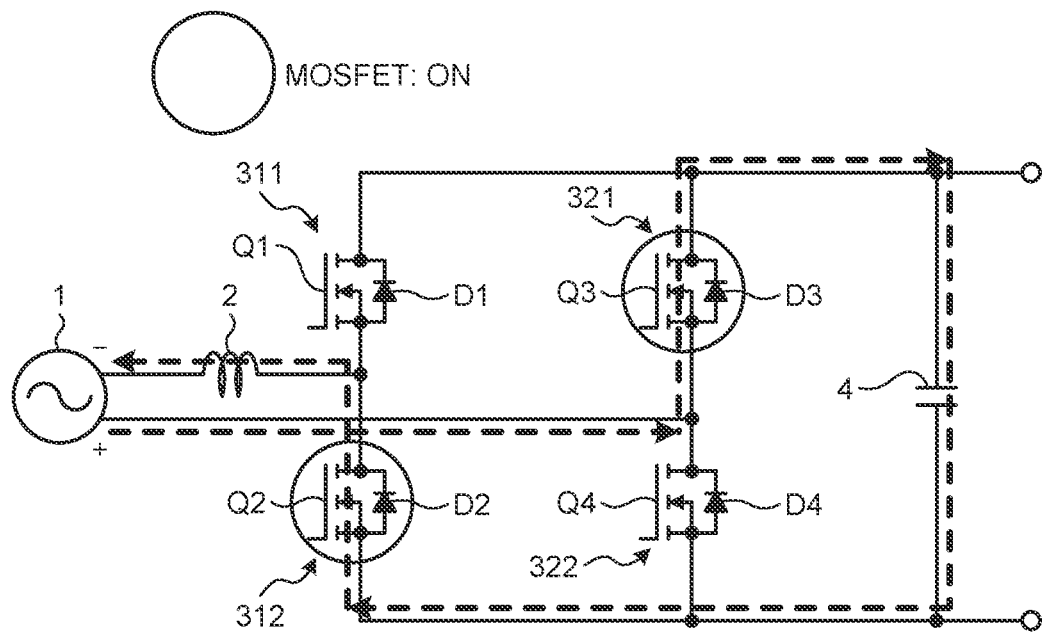
FIG. 6 is a second diagram illustrating a path of a current flowing through the converter in the first embodiment.

FIG. 6 is a second diagram illustrating a path of the current flowing through the converter 3 in the first embodiment. FIG. 6 illustrates a state in which the power supply voltage polarity is negative, and the absolute value of the detected value Is of the power supply current is larger than the current threshold. In this state, the first lower arm element 312 and the second upper arm element 321 are on, and the first upper arm element 311 and the second lower arm element 322 are off. At this time, the current flows through the alternating current power supply 1, the switching element Q3, the smoothing capacitor 4, the switching element Q2, the reactor 2, and the alternating current power supply 1 in this order. As described above, in the first embodiment, there is a case where a synchronous rectification operation is performed in which the current is not caused to flow through the diode D3 and the diode D2, but is caused to flow through the channel of each of the switching elements Q3 and Q2.

Figure 7:
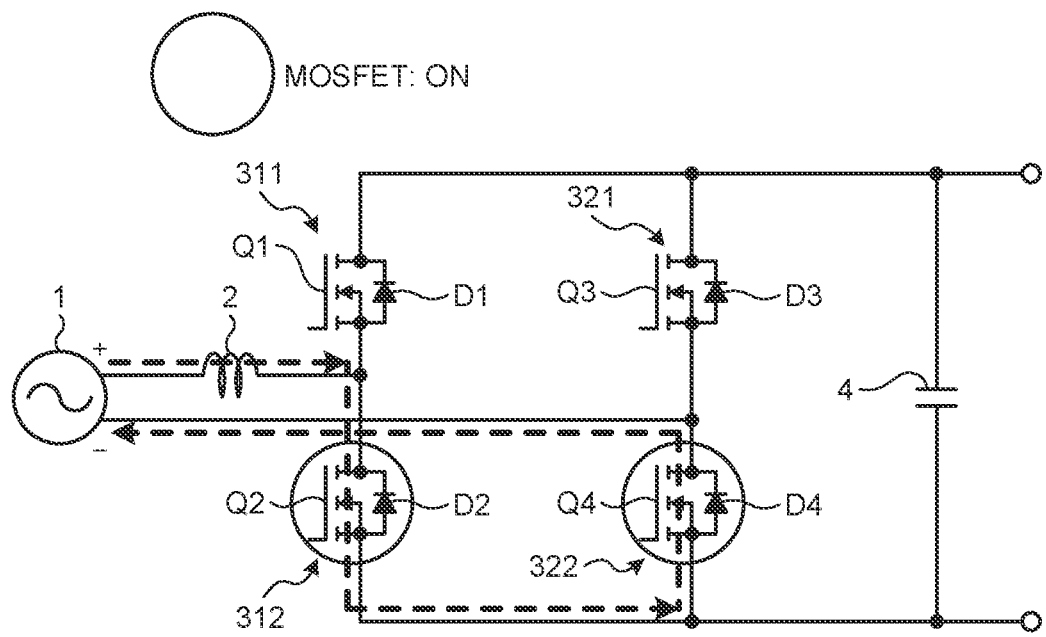
FIG. 7 is a third diagram illustrating a path of a current flowing through the converter in the first embodiment.

FIG. 7 is a third diagram illustrating a path of the current flowing through the converter 3 in the first embodiment. FIG. 7 illustrates a state in which the power supply voltage polarity is positive, and the absolute value of the detected value Is of the power supply current is larger than the current threshold. In this state, the first lower arm element 312 and the second lower arm element 322 are on, and the first upper arm element 311 and the second upper arm element 321 are off. At this time, the current flows through the alternating current power supply 1, the reactor 2, the switching element Q2, the switching element Q4, and the alternating current power supply 1 in this order. As a result, a power supply short-circuit path that does not pass through the smoothing capacitor 4 is formed. When the power supply short-circuit path illustrated in FIG. 7 is formed, the first lower arm element 312 needs to be turned on, but the second lower arm element 322 may be either turned on or turned off. As illustrated in FIG. 7, the first embodiment includes a mode in which the power supply short-circuit path is formed by causing the current to flow not through the diode D4 but through the channel of the switching element Q4.

Figure 8:
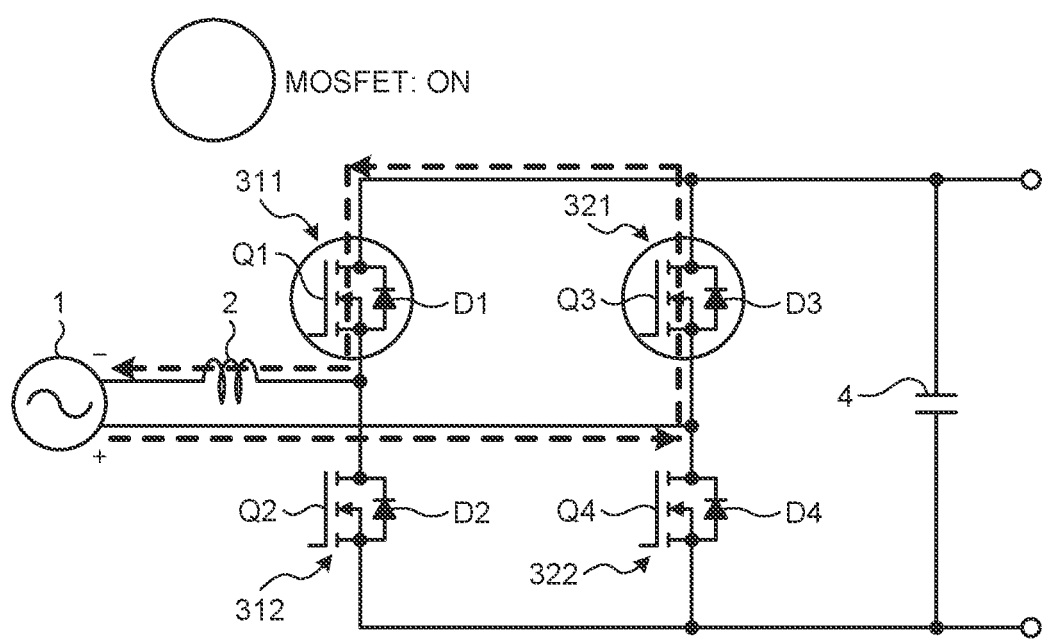
FIG. 8 is a fourth diagram illustrating a path of a current flowing through the converter in the first embodiment.

FIG. 8 is a fourth diagram illustrating a path of the current flowing through the converter 3 in the first embodiment. FIG. 8 illustrates a state in which the power supply voltage polarity is negative, and the absolute value of the detected value Is of the power supply current is larger than the current threshold. In this state, the first upper arm element 311 and the second upper arm element 321 are on, and the first lower arm element 312 and the second lower arm element 322 are off. At this time, the current flows through the alternating current power supply 1, the switching element Q3, the switching element Q1, the reactor 2, and the alternating current power supply 1 in this order. As a result, a power supply short-circuit path that does not pass through the smoothing capacitor 4 is formed. When the power supply short-circuit path illustrated in FIG. 8 is formed, the first upper arm element 311 needs to be turned on, but the second upper arm element 321 may be either turned on or turned off. As illustrated in FIG. 8, the first embodiment includes a mode in which the power supply short-circuit path is formed by causing the current to flow not through the diode D3 but through the channel of the switching element Q3.

The control unit 10 can control the values of the power supply current and the bus voltage by controlling the switching of the current path described above. When the power supply voltage polarity is positive, the motor drive apparatus 100 continuously switches between the operation illustrated in FIG. 5 and the operation illustrated in FIG. 7. When the power supply voltage polarity is negative, the motor drive apparatus 100 continuously switches between the operation illustrated in FIG. 6 and the operation illustrated in FIG. 8. As a result, it is possible to implement control for increasing the bus voltage, control for reducing an increase in the bus voltage, current control for improving the power factor and power supply harmonics, and the synchronous rectification for improving the operation efficiency.

Figure 9:
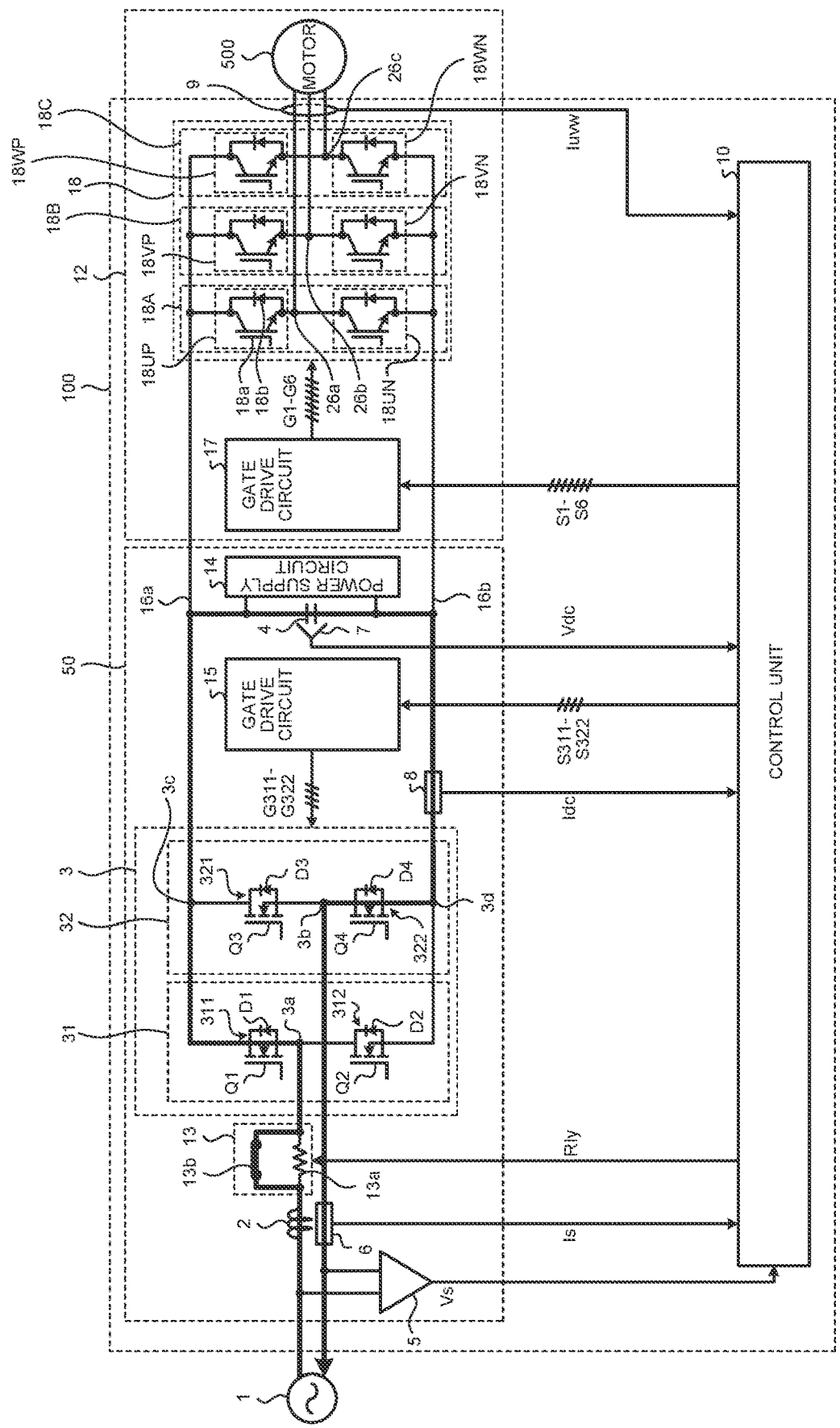
FIG. 9 is a diagram for explaining an inrush current at the time of an instantaneous power failure that can occur in the direct current power supply device of the first embodiment.

Next, an inrush current at the time of an instantaneous power failure that can occur in the direct current power supply device 50 will be described. FIG. 9 is a diagram for explaining an inrush current at the time of an instantaneous power failure that can occur in the direct current power supply device 50 of the first embodiment. Note that the instantaneous power failure refers to a phenomenon in which the power supply voltage instantaneously or temporarily decreases to, for example, less than 50 V.

When the instantaneous power failure has occurred and the power consumption of the load 12 is high, the electric charge of the smoothing capacitor 4 is rapidly consumed, and the bus voltage decreases. Meanwhile, the power supply circuit 14 includes a capacitor (not illustrated) for stabilizing the voltage. The current for driving the relay 13b of the inrush current preventing circuit 13 is small. Accordingly, the decrease in the voltage for operating the relay 13b is gentler than the decrease in the bus voltage. Therefore, the state in which the instantaneous power failure has occurred during the operation of the load 12 is a state in which the bus voltage is decreased and a state in which the relay 13b of the inrush current preventing circuit 13 is conducted. When the power supply voltage is restored in this state, the charging current flows through the smoothing capacitor 4 without passing through the inrush current preventing resistor 13a in a path as illustrated in FIG. 9. This current is an excessive current, which causes deterioration or damage of circuit components in the path of the charging current.

Moreover, in the first embodiment, synchronous rectification is performed in which the switching elements Q1 to Q4 connected in parallel to the diodes D1 to D4 are controlled to be turned on at an appropriate timing at a timing when the current flows through the diodes D1 to D4. However, when an excessive current is generated, the outputs of the current detection units 6 and 8 are saturated, so that an accurate current value cannot be acquired, and the synchronous rectification cannot be performed at an appropriate timing. Note that it is also conceivable to reduce the detection sensitivity of the current detection units 6 and 8 in consideration of the excessive current caused by the instantaneous power failure as described above. However, a reduction in the detection sensitivity results in a reduction in the sensitivity of the current that is originally to be detected, and there is a possibility that the current cannot be accurately detected when the current value is small. Note that although such a situation can be resolved by using a current detector having a wide detection range, an increase in cost is inevitable.

Figure 10:
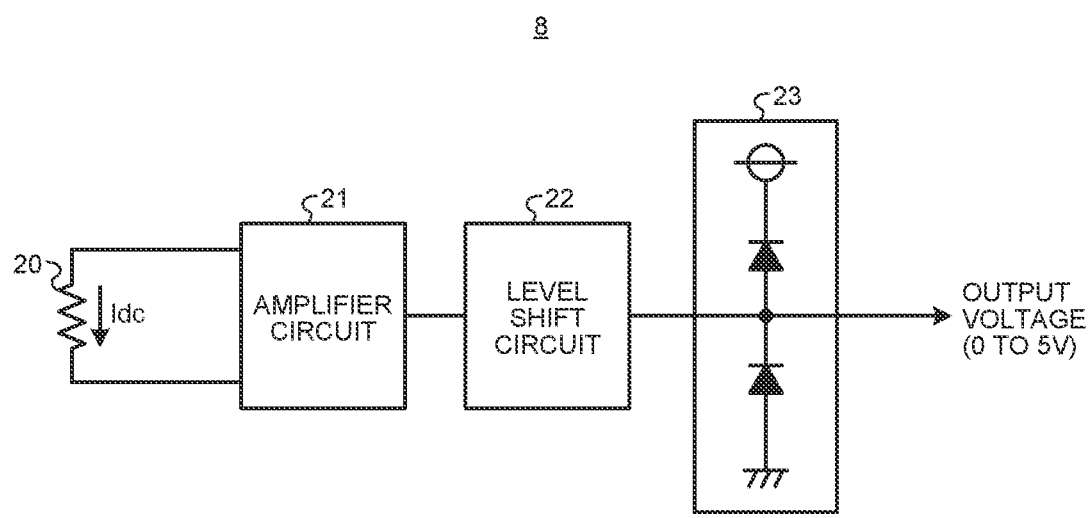
FIG. 10 is a diagram illustrating an example of a configuration of a current detection unit in the first embodiment.
Figure 11:
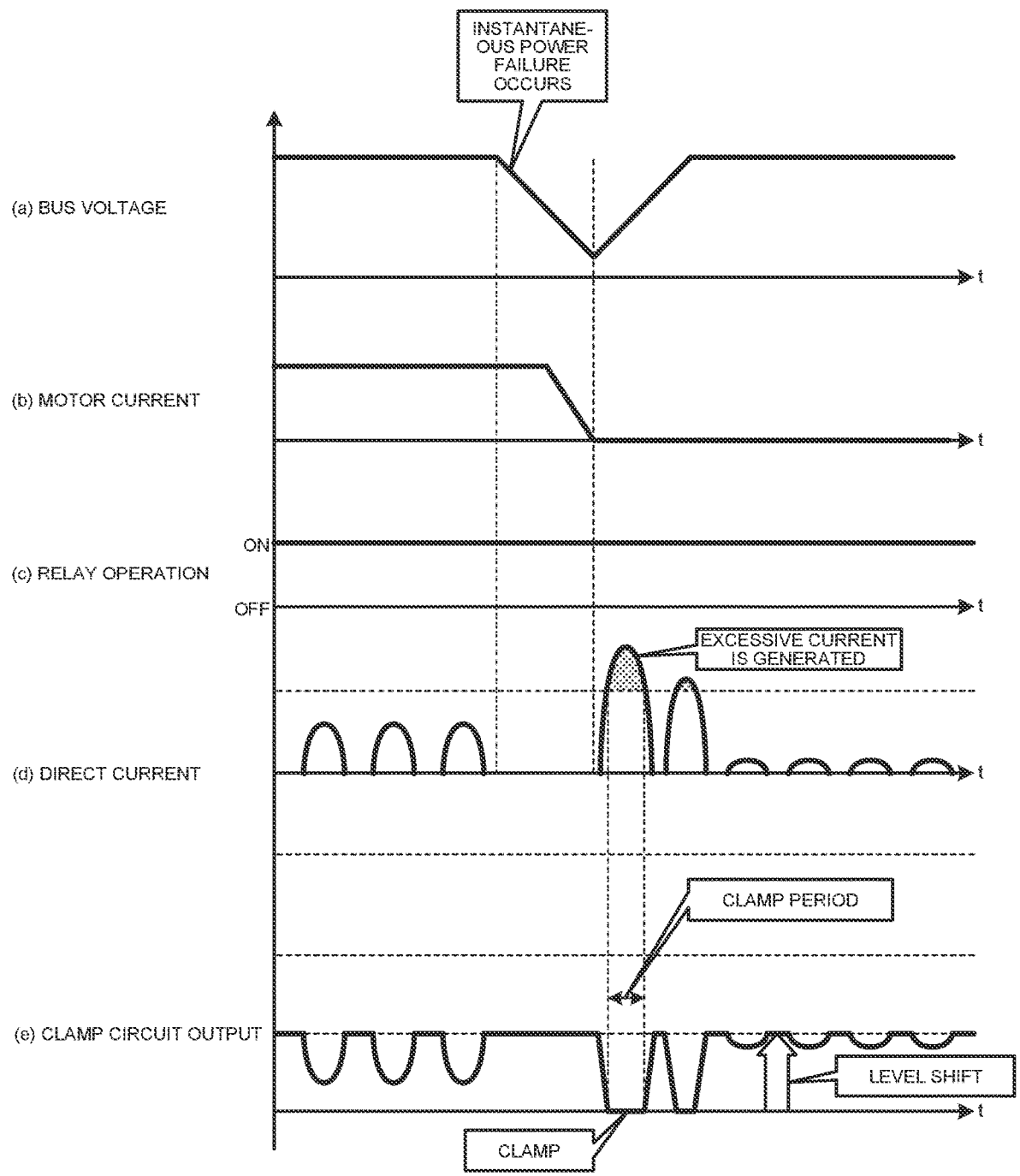
FIG. 11 is a first diagram illustrating an example of operation of the current detection unit in the first embodiment.

In view of the above, in the first embodiment, the current detection unit 8 is configured as illustrated in FIG. 10. FIG. 10 is a diagram illustrating an example of a configuration of the current detection unit 8 in the first embodiment. In FIG. 10, the current detection unit 8 includes a shunt resistor 20, an amplifier circuit 21, a level shift circuit 22, and a clamp circuit 23. FIG. 11 is a first diagram illustrating an example of operation of the current detection unit 8 in the first embodiment. FIG. 11 illustrates an operating waveform of each unit of the current detection unit 8 at the time of the instantaneous power failure. In FIG. 11, (a) illustrates a bus voltage, (b) illustrates a motor current, (c) illustrates a relay operating state, (d) illustrates a direct current flowing through the shunt resistor 20, and (e) illustrates an output of the clamp circuit 23.

The amplifier circuit 21 amplifies a voltage across the shunt resistor 20 generated by the direct current flowing through the shunt resistor 20. The shunt resistor 20 is an example of the current detector included in the current detection unit 8. The output value of the shunt resistor 20 is a voltage value. That is, the shunt resistor 20 is a detector that detects a physical quantity corresponding to the direct current flowing through the shunt resistor 20. The shunt resistor 20 is disposed in the charging path of the smoothing capacitor 4, and thus desirably has a small resistance value in consideration of the loss and the heat generation surface. Therefore, the voltage across the shunt resistor 20 has an extremely low value when the direct current flows therethrough. It is thus desirable to provide the amplifier circuit 21 as illustrated in FIG. 10.

Note that the power supply circuit 14 generates a direct current voltage for operation using the voltage of the smoothing capacitor 4. Thus, in the case of generating the direct current voltage as a non-isolated power supply, it is common to set a negative electrode side of the smoothing capacitor 4 as ground (GND). In this case, when the current detection unit 8 includes the shunt resistor 20, the charging current of the smoothing capacitor 4 is detected as a negative voltage. On the other hand, a microcomputer that is a typical example of the processor 300 is generally configured to detect a positive voltage of about 0 to 5 V, and does not support a negative voltage. Thus, the voltage detected by the shunt resistor 20 cannot be input as it is. Therefore, the level shift circuit 22 shifts the level of the output of the amplifier circuit 21 such that the output voltage of the clamp circuit 23, which is the output of the current detection unit 8, is at a level allowed for input to the processor 300 of the control unit 10. In FIG. 11, (e) illustrates how the amplifier circuit 21 adjusts the level and inverts the signal, how the level shift circuit 22 shifts the level of the current value, how the clamp circuit 23 clamps the current value, and the like.

In the current detection unit 8, for example, when an analog input voltage of the microcomputer is in the range of 0 to 5 V, the level is shifted by 2.5 V, and gain adjustment is performed such that the voltage falls within the range of 0 to 5 V. However, when it is assumed that an excessive current flows, because there is a large difference between the excessive current and the current during normal operation, if gain adjustment is performed such that the excessive current also falls within the voltage range, the resolution for detecting the current flowing during normal operation cannot be achieved. Therefore, the gain design is performed on the basis of the operation during normal operation, and the input voltage exceeding the range of 0 to 5 V is clamped by the clamp circuit 23 so as to have a voltage value between the 5 V potential and the GND potential. This can protect the microcomputer from application of an excessive voltage thereto.

Note that when the synchronous rectification is performed, it is sufficient that the period during which the current flows through the diodes D1 to D4 can be detected. When the instantaneous power failure occurs, an excessive current is generated as illustrated in (d) in the example of FIG. 11. Meanwhile, the period during which the voltage of the clamp circuit 23 is clamped is the period during which the excessive current flows as illustrated in (e) in FIG. 11. In the synchronous rectification, even if the current value cannot be detected, it is sufficient if it is possible to determine a timing at which the current flows and a direction in which the current flows, that is, whether the current flows in a positive direction or a negative direction. Therefore, the synchronous rectification can be performed even when the detected value is saturated due to the excessive current. Furthermore, in the control unit 10, it is possible to detect a negative voltage by subtracting the voltage corresponding to the level shift and inverting the sign of the voltage value.

Figure 12:
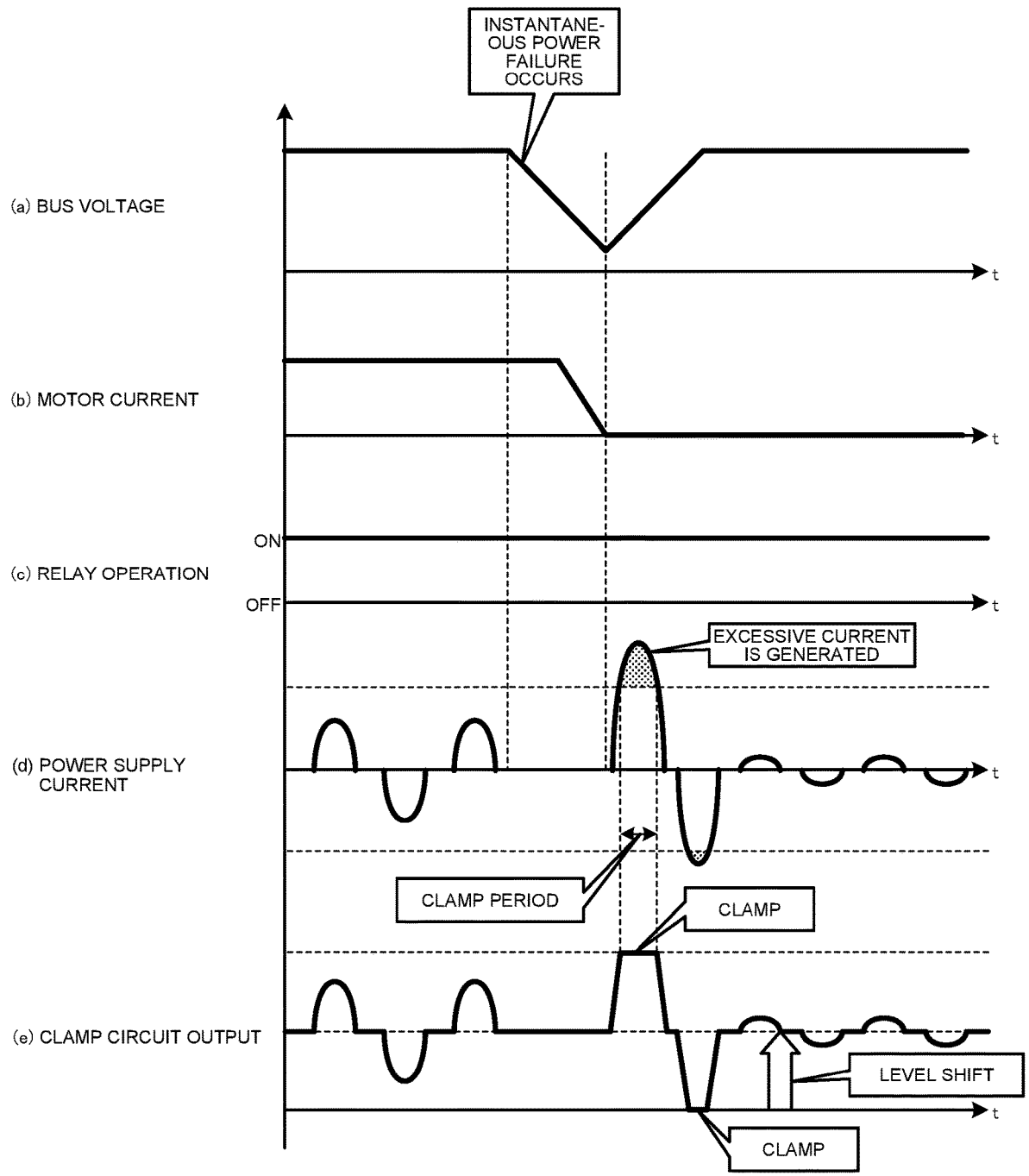
FIG. 12 is a second diagram illustrating an example of operation of the current detection unit in the first embodiment.

Although the current detection unit 8 that detects the direct current has been described above, the current detection unit 6 that detects the power supply current can also be configured similarly to FIG. 10. FIG. 12 is a second diagram illustrating an example of operation of the current detection unit 6 in the first embodiment. FIG. 12 illustrates an operating waveform of each unit of the current detection unit 6 at the time of the instantaneous power failure. In FIG. 12, (a) illustrates a bus voltage, (b) illustrates a motor current, (c) illustrates a relay operating state, (d) illustrates a power supply current, and (e) illustrates a clamp circuit output. Differences from FIG. 11 are that the power supply current has positive and negative polarities and the output of the clamp circuit changes above and below the level shift voltage, and the other characteristics are the same as those of FIG. 11.

Note that the current detection units 6 and 8 can perform the above operation on condition that the direct current voltage for operation is generated by the power supply circuit 14. As described above, when the bus voltage that is the voltage across the smoothing capacitor 4 is about 50 V, the power supply circuit 14 can generate the low-voltage direct current voltage such as 5 V, 12 V, 15 V, or 24 V. That is, the bus voltage at which the power supply circuit 14 generates the low-voltage direct current voltage has a lower limit value. It is desirable that the circuit components included in the direct current power supply device 50 have resistance against an inrush current generated by the power supply voltage applied at the time of recovery from the instantaneous power failure and the lower limit value of the bus voltage. In particular, in a case where the current detection unit 8 is a shunt resistor, the power rating value of the shunt resistor is desirably set to be higher than a power value obtained from the current value flowing at the time of recovery of the power supply voltage and the resistance value of the shunt resistor. As a result, it is possible to prevent or reduce variations in the detected value of the shunt resistor due to an increase in temperature of the shunt resistor caused by the inrush current at the time of recovery from the instantaneous power failure. It is also possible to prevent deterioration of the shunt resistor itself due to the increase in temperature of the shunt resistor.

In a case where the switching elements Q1 to Q4 are SiC-MOSFETs, when the current is caused to flow through the parasitic diodes, the voltage drop of the parasitic diodes increases to increase the loss of the MOSFETs and accelerate the deterioration of the MOSFETs. In particular, when an excessive current such as the inrush current flows, the rate of progress of deterioration increases. However, by using the current information detected by the current detection units 6 and 8 of the first embodiment configured as described above, it is possible to appropriately control the switching elements Q1 to Q4 connected in parallel to the corresponding diodes D1 to D4. As a result, it is possible to prevent the excessive current from flowing to the parasitic diodes and decrease the rate of progress of deterioration of the SiC-MOSFETs.

Note that conventionally, in a manufacturing process of manufacturing the SiC-MOSFET, screening for reducing a market failure rate of the SiC-MOSFET by passing a current through the parasitic diode has been performed. However, the use of the current detection units 6 and 8 of the first embodiment can reduce or eliminate the manufacturing cost required for screening performed in the manufacturing process. Moreover, if the switching elements Q1 to Q4 can be appropriately controlled, it is not necessary to connect a Schottky barrier diode separately from the parasitic diode. This can significantly reduce the manufacturing cost of the SiC-MOSFET.

Note that there is also a method of detecting a decrease in the bus voltage and opening the relay 13*b* of the inrush current preventing circuit 13. However, in a case where the relay 13*b* includes a mechanical electromagnetic contactor, the response speed is several tens of milliseconds. In a case where the frequency of the power supply voltage is 50 hertz, a half cycle of the power supply cycle is 10 milliseconds. Therefore, in the case of performing the control to open the relay 13*b* by detecting a decrease in the bus voltage, when the voltage drop due to the instantaneous power failure is about a half cycle or one cycle of the power supply cycle, the power supply voltage is turned on again before the relay 13*b* is opened. In this case, since the smoothing capacitor 4 is charged before the relay 13*b* is opened, an excessive current may flow. Moreover, when a contact of the relay 13*b* is opened in a state in which an excessive current flows through the contact of the relay 13*b*, arc discharge may occur, leading to welding of the contact of the relay 13*b*. If the direct current power supply device 50 continues to be used with the contact being welded, an inrush current may continue to flow every time the power supply voltage is turned on. Such a problem does not occur in the technique of the first embodiment described above. Therefore, the direct current power supply device 50 with high reliability can be configured by using the technique of the first embodiment.

Figure 13:
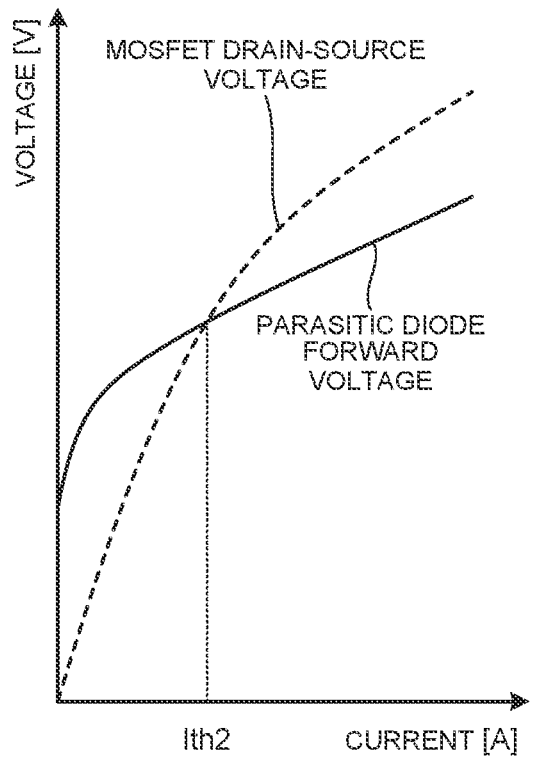
FIG. 13 is a graph illustrating a loss characteristic of a MOSFET used in the direct current power supply device of the first embodiment.

Next, a loss characteristic of the MOSFET used in the motor drive apparatus 100 will be described. FIG. 13 is a graph illustrating the loss characteristic of the MOSFET used in the direct current power supply device 50 according to the first embodiment. In FIG. 13, the horizontal axis represents the current flowing through the MOSFET in an ON state and the current flowing through the parasitic diode. Moreover, the vertical axis represents the voltage required for passing the current to the switching element in the ON state and the voltage required for passing the current to the parasitic diode.

In FIG. 13, a solid line represents a parasitic diode forward voltage. The parasitic diode forward voltage is an example of a current-voltage characteristic representing a loss that occurs in the parasitic diode. Generally, when the current value is small, the diode requires a large voltage because of a large loss. However, when the current value is larger than a certain value, the rate of change in loss is improved, so that the slope of the current-voltage characteristic is relaxed. This characteristic appears in the waveform indicated by the solid line in FIG. 13.

Moreover, a broken line represents a MOSFET drain-source voltage that is a voltage between a drain and a source of the MOSFET. The MOSFET drain-source voltage is an example of a current-voltage characteristic representing the current flowing through the carrier of the switching element and the loss caused by the on-resistance of the switching element by the current flowing. In the switching element such as the MOSFET, the voltage required for passing the current increases in a quadratic curve manner with respect to the current value. This characteristic appears in the waveform indicated by the broken line in FIG. 13.

In FIG. 13, a cross point at which the solid line and the broken line intersect is a point at which the current flowing through the parasitic diode and the voltage required for passing that current are equal to the current flowing through the MOSFET and the voltage required for passing that current. In the first embodiment, a current value at the cross point at which the two current-voltage characteristics of the parasitic diode and the switching element intersect is referred to as a "second current threshold". Note that the current threshold described above, that is, the current threshold used for comparison with the absolute value of the detected value Is of the power supply current, is referred to as a "first current threshold". In FIG. 13, the second current threshold is represented by "Ith2". The second current threshold is a value larger than the first current threshold.

Figure 14:
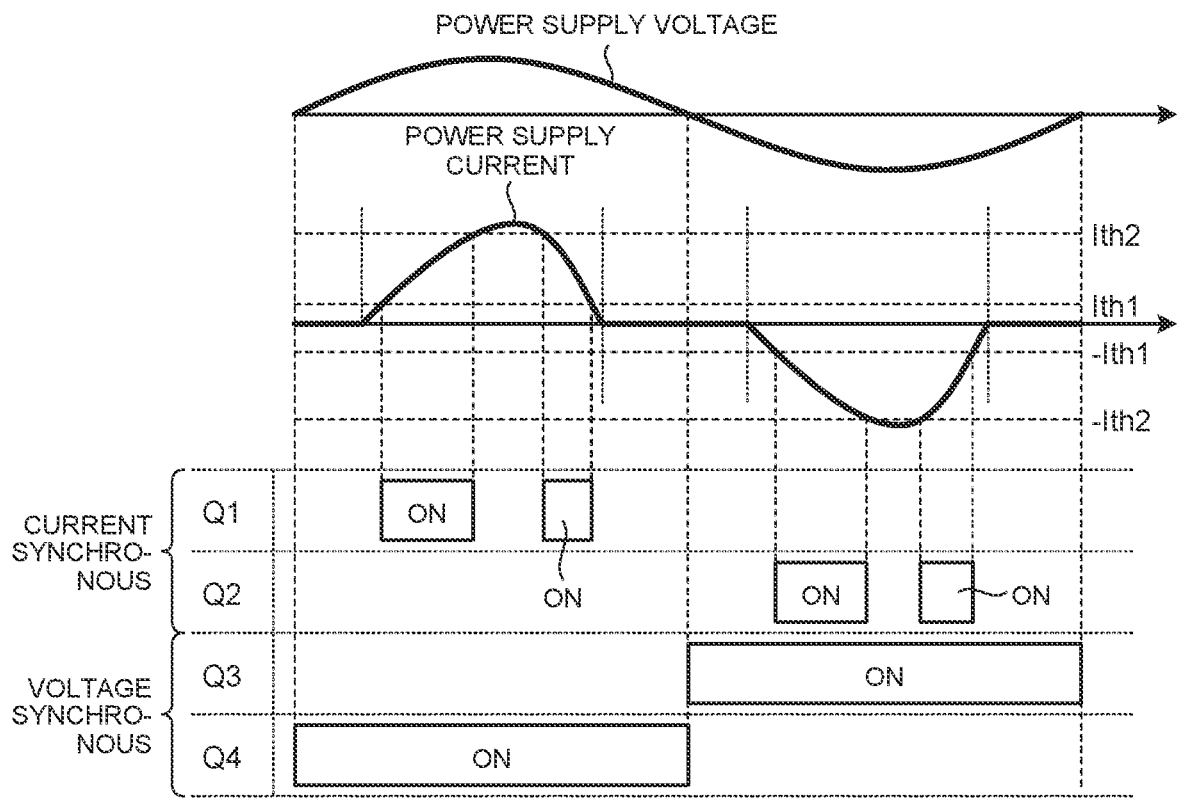
FIG. 14 is a diagram illustrating a timing at which the control unit turns on a switching element in the direct current power supply device according to the first embodiment.

Next, a description will be made of the timing at which the control unit 10 turns on and off the switching element using the first current threshold and the second current threshold in the synchronous rectification mode. FIG. 14 is a diagram illustrating the timing at which the control unit 10 turns on the switching element in the direct current power supply device 50 according to the first embodiment. In FIG. 14, the horizontal axis represents time. The upper part of FIG. 14 illustrates waveforms of the power supply voltage and the power supply current. The lower part of FIG. 14 illustrates that the switching elements Q1 and Q2 are current synchronous switching elements that are controlled to be turned on and off according to the polarity of the power supply current, and that the switching elements Q3 and Q4 are voltage synchronous switching elements that are controlled to be turned on and off according to the polarity of the power supply voltage. Along with the waveform of the power supply current, FIG. 14 illustrates values of the first current threshold Ith1 and the second current threshold Ith2. Note that although FIG. 14 illustrates one cycle of the alternating current power output from the alternating current power supply 1, the control unit 10 is assumed to perform control similar to the control illustrated in FIG. 14 in other cycles.

In a case where the power supply voltage polarity is positive, the control unit 10 turns on the switching element Q4 and turns off the switching element Q3. In a case where the power supply voltage polarity is negative, the control unit 10 turns on the switching element Q3 and turns off the switching element Q4. Note that in FIG. 14, the timing at which the switching element Q4 is turned from on to off coincides with the timing at which the switching element Q3 is turned from off to on, but the timing is not limited thereto. The control unit 10 may set a dead time in which both the switching elements Q3 and Q4 are turned off between the timing at which the switching element Q4 is turned from on to off and the timing at which the switching element Q3 is turned from off to on. Similarly, the control unit 10 may set a dead time in which both the switching elements Q3 and Q4 are turned off between the timing at which the switching element Q3 is turned from on to off and the timing at which the switching element Q4 is turned from off to on.

In the case where the power supply voltage polarity is positive, the control unit 10 turns on the switching element Q1 when the absolute value of the power supply current becomes greater than or equal to the first current threshold Ith1. Furthermore, when the absolute value of the power supply current exceeds the second current threshold Ith2, the switching element Q1 is turned off. After that, when the absolute value of the power supply current decreases and becomes less than or equal to the second current threshold Ith2, the control unit 10 turns on the switching element Q1. Furthermore, when the absolute value of the power supply current becomes smaller than the first current threshold Ith1, the switching element Q1 is turned off. In the case where the power supply voltage polarity is negative, the control unit 10 turns on the switching element Q2 when the absolute value of the power supply current becomes greater than or equal to the first current threshold Ith1. Furthermore, when the absolute value of the power supply current exceeds the second current threshold Ith2, the switching element Q2 is turned off. After that, when the absolute value of the power supply current decreases and becomes less than or equal to the second current threshold Ith2, the control unit 10 turns on the switching element Q2. Furthermore, when the absolute value of the power supply current becomes smaller than the first current threshold Ith1, the switching element Q2 is turned off.

In a case where the absolute value of the power supply current is less than or equal to the first current threshold Ith1, the control unit 10 performs control such that the switching elements Q1 and Q3 are not simultaneously turned on, and performs control such that the switching elements Q2 and Q4 are not simultaneously turned on. As a result, the control unit 10 can prevent a capacitor short circuit in the motor drive apparatus 100.

Under the control of the control unit 10 described above, the motor drive apparatus 100 can implement synchronous rectification by the switching elements Q1 and Q2 of the first leg 31. Specifically, when the absolute value of the power supply current is greater than or equal to the first current threshold Ith1 and less than or equal to the second current threshold Ith2, the control unit 10 causes the current to flow through the switching element Q1 or the switching element Q2 having a smaller loss in this range. Also, when the absolute value of the power supply current is greater than the second current threshold Ith2, the control unit 10 causes the current to flow through the diode D1 or the diode D2 having a smaller loss in this range. Therefore, the motor drive apparatus 100 can cause the current to flow through the element having a small loss according to the current value, and thus can be a highly efficient apparatus in which a decrease in efficiency is prevented and the loss is reduced.

Note that the control unit 10 may perform the boosting operation by performing switching control to turn on and off the switching elements Q1 and Q2 complementarily in the period in which the switching element Q1 is turned on. Similarly, the control unit 10 may perform the boosting operation by performing switching control to turn on and off the switching elements Q1 and Q2 complementarily in the period in which the switching element Q2 is turned on.

That is, when the absolute value of the power supply current is greater than or equal to the first current threshold Ith1 and less than or equal to the second current threshold Ith2, the control unit 10 allows turning on of one of the switching elements Q1 and Q2 included in the first leg 31 being one of the first leg 31 and the second leg 32 according to the polarity of the power supply current. Also, when the absolute value of the power supply current is less than the first current threshold Ith1 or greater than the second current threshold Ith2, the control unit 10 prohibits turning on of one of the switching elements Q1 and Q2 that is the same as that described above.

Specifically, when the polarity of the power supply current is positive, and the absolute value of the power supply current is greater than or equal to the first current threshold Ith1 and less than or equal to the second current threshold Ith2, the control unit 10 allows the switching element Q1 to be turned on. When the absolute value of the power supply current is less than the first current threshold Ith1 or greater than the second current threshold Ith2, the control unit 10 prohibits the switching element Q1 from being turned on. When the polarity of the power supply current is positive, and the absolute value of the power supply current is greater than or equal to the first current threshold Ith1 and less than or equal to the second current threshold Ith2, the control unit 10 turns on the switching element Q2 in the period in which the switching element Q1 is turned off. When the absolute value of the power supply current is less than the first current threshold Ith1 or greater than the second current threshold Ith2, the control unit 10 prohibits the switching element Q2 from being turned on as well.

Moreover, when the polarity of the power supply current is negative, and the absolute value of the power supply current is greater than or equal to the first current threshold Ith1 and less than or equal to the second current threshold Ith2, the control unit 10 allows the switching element Q2 to be turned on. When the absolute value of the power supply current is less than the first current threshold Ith1 or greater than the second current threshold Ith2, the control unit 10 prohibits the switching element Q2 from being turned on. Also, when the polarity of the power supply current is negative, and the absolute value of the power supply current is greater than or equal to the first current threshold Ith1 and less than or equal to the second current threshold Ith2, the control unit 10 turns on the switching element Q1 in the period in which the switching element Q2 is turned off. When the absolute value of the power supply current is less than the first current threshold Ith1 or greater than the second current threshold Ith2, the control unit 10 prohibits the switching element Q1 from being turned on as well.

As described above, the control unit 10 allows the switching element to be turned on in the range where the absolute value of the power supply current is greater than or equal to the first current threshold Ith1 and the loss of the switching element is smaller than the loss of the parasitic diode. In addition, the control unit 10 prohibits the switching element from being turned on in the range where the loss of the switching element is larger than the loss of the parasitic diode.

Note that in the example of FIG. 14, the control unit 10 controls the switching elements Q3 and Q4 to be turned on and off according to the polarity of the power supply voltage and controls the switching elements Q1 and Q2 to be turned on and off according to the polarity of the power supply current, but this is not a limitation. The control unit 10 may control the switching elements Q1 and Q2 to be turned on and off according to the polarity of the power supply voltage, and may control the switching elements Q3 and Q4 to be turned on and off according to the polarity of the power supply current.

Moreover, as described above, the second current threshold Ith2 is the current value when the voltages required for passing the current to the parasitic diode and the switching element have the same value, but is not limited thereto. The second current threshold Ith2 may be a value determined according to the characteristic of the voltage required for passing the current to the parasitic diode and the characteristic of the voltage required for passing the current to the switching element.

For example, the second current threshold Ith2 may be a value obtained by increasing, according to a switching loss generated in the switching element, the current value when the voltages required for passing the current to the parasitic diode and the switching element have the same value. As a result, it is possible to determine the second current threshold Ith2 in consideration of the switching loss generated when the switching element is switched from on to off. In this case, the control unit 10 keeps the switching element on when a reduction in loss cannot be expected by turning off the switching element even when the absolute value of the power supply current further increases in a state where the switching element is turned on. As a result, the motor drive apparatus 100 can further prevent a decrease in efficiency.

Moreover, the second current threshold Ith2 may be a value obtained by adding or subtracting a prescribed value to or from the current value when the voltages required for passing the current to the parasitic diode and the switching element have the same value. As a result, it is possible to determine the second current threshold Ith2 in consideration of a difference in the characteristics due to component variations of each element. In this case, there is a possibility that the control unit 10 cannot improve the reduction in loss as compared to the case where the second current threshold Ith2 is the current value when the voltages required for passing the current to the parasitic diode and the switching element have the same value. However, the control unit 10 can reduce the loss as compared to the case where the switching element is continuously turned on even when the absolute value of the power supply current further increases in the state where the switching element is turned on.

Figure 15:
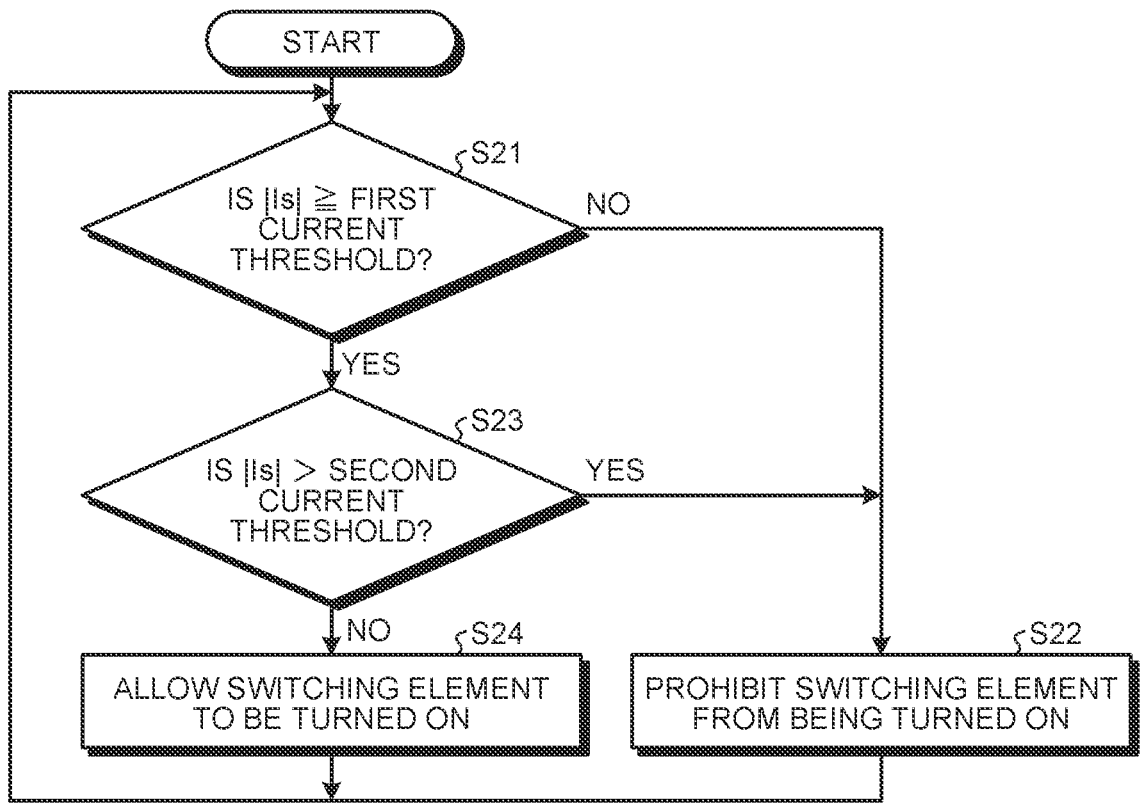
FIG. 15 is a flowchart used to describe an operation of a main part in the first embodiment.

FIG. 15 is a flowchart used to describe an operation of the main part in the first embodiment. FIG. 15 illustrates a processing flow in which the control unit 10 of the motor drive apparatus 100 performs on/off control on the switching elements Q1 and Q2. Note that here, as an example, a case where the polarity of the power supply current is positive will be described.

The control unit 10 compares an absolute value |Is| of the detected value Is of the power supply current with the first current threshold (step S21). If the absolute value |Is| is less than the first current threshold (No in step S21), the control unit 10 prohibits the switching element Q1 from being turned on (step S22). If the absolute value |Is| is greater than or equal to the first current threshold (Yes in step S21), the control unit 10 compares the absolute value Is with the second current threshold (step S23). If the absolute value |Is| is less than or equal to the second current threshold (No in step S23), the control unit 10 allows the switching element Q1 to be turned on (step S24). If the absolute value |Is| is greater than the second current threshold (Yes in step S23), the control unit 10 prohibits the switching element Q1 from being turned on (step S22). After step S22 or step S24, the control unit 10 returns to step S21 and repeats the above processing. When the polarity of the power supply current is negative, the control unit 10 performs processing similar to that described above on the switching element Q2.

Note that in step S21 above, the case where the absolute value |Is| is equal to the first current threshold is determined to be "Yes", but may be determined to be "No". That is, the case where the absolute value |Is| is equal to the first current threshold may be determined to be either "Yes" or "No". Also, in step S23 above, the case where the absolute value |Is| is equal to the second current threshold is determined to be "No", but may be determined to be "Yes". That is, the case where the absolute value |Is| is equal to the second current threshold may be determined to be either "Yes" or "No".

Next, a configuration of the switching element will be described. In the motor drive apparatus 100, one method of increasing the switching speed of the switching element is a method of decreasing the gate resistance of the switching element. As the gate resistance decreases, the charge/discharge time to the gate input capacitance decreases, which shortens the turn-on period and the turn-off period, so that the switching speed increases.

However, there is a limit to reducing the switching loss by decreasing the gate resistance. Therefore, the switching element is for example formed of a WBG semiconductor such as GaN or SiC. By using the WBG semiconductor for the switching element, the loss per switching can be further reduced; therefore, the efficiency is further improved and high-frequency switching can be performed. Moreover, the reactor 2 can be downsized by enabling the high-frequency switching, so that the motor drive apparatus 100 can be reduced in size and weight. In addition, the use of the WBG semiconductor for the switching element improves the switching speed and reduces the switching loss. As a result, it is possible to simplify heat dissipation measures that enable the switching element to continue normal operation. Moreover, the use of the WBG semiconductor for the switching element can set the switching frequency to a sufficiently high value such as 16 kHz or higher. As a result, noise caused by switching can be prevented or reduced.

Moreover, in the GaN semiconductor, a two-dimensional electron gas is generated at an interface between a GaN layer and an aluminum gallium nitride layer, and the carrier mobility is high due to the two-dimensional electron gas. Therefore, the switching element using the GaN semiconductor can achieve high-speed switching. Here, in a case where the alternating current power supply 1 is a commercial power supply of 50 Hz or 60 Hz, the audible range frequency is in a range from 16 kHz to 20 kHz, that is, in a range from 266 times to 400 times the frequency of the commercial power supply. The GaN semiconductor is suitable for switching at a frequency higher than this audible range frequency. In a case where the switching elements Q1 to Q4 made of silicon (Si), which is a mainstream semiconductor material, are driven at a switching frequency of several tens of kHz or higher, the ratio of the switching loss increases, so that heat dissipation measures are essential. On the other hand, the switching elements Q1 to Q4 made of the GaN semiconductors have a very small switching loss even when driven at a switching frequency of several tens of kHz or higher, specifically, at a switching frequency higher than 20 kHz. Therefore, it is not necessary to take heat dissipation measures, or a heat dissipation member used for the heat dissipation measures can be reduced in size, whereby the motor drive apparatus 100 can be reduced in size and weight. In addition, the reactor 2 can be downsized by enabling high-frequency switching. Note that in order to prevent a primary component of the switching frequency from entering a measurement range of the conducted emission standard, the switching frequency is preferably 150 kHz or lower.

Moreover, the WBG semiconductor has a smaller capacitance than the Si semiconductor and thus has less recovery current generated due to switching, thereby being able to prevent or reduce the generation of loss and noise due to the recovery current. Therefore, the WBG semiconductor is suitable for high-frequency switching.

Note that the SiC semiconductor has smaller on-resistance than the GaN semiconductor. Therefore, the first upper arm element 311 and the first lower arm element 312 of the first leg 31 having a larger number of switching operations than the second leg 32 may be made of the GaN semiconductor, and the second upper arm element 321 and the second lower arm element 322 of the second leg 32 having a smaller number of switching operations may be made of the SiC semiconductor. This makes it possible to make the most of the characteristics of each of the SiC semiconductor and the GaN semiconductor. In addition, by using the SiC semiconductor for the second upper arm element 321 and the second lower arm element 322 of the second leg 32 having a smaller number of switching operations than the first leg 31, the proportion occupied by the conduction loss among the losses of the second upper arm element 321 and the second lower arm element 322 increases, and the turn-on loss and the turn-off loss are reduced. Therefore, an increase in heat generation due to switching of the second upper arm element 321 and the second lower arm element 322 is prevented, and the chip areas of the second upper arm element 321 and the second lower arm element 322 included in the second leg 32 can be relatively reduced. This makes it possible to effectively utilize the SiC semiconductor having a low yield at the time of manufacturing a chip.

Moreover, the SJ-MOSFET having the super junction structure may be used for the second upper arm element 321 and the second lower arm element 322 of the second leg 32 having a small number of switching operations. The use of the SJ-MOSFET can avoid a disadvantage that the capacitance is high and recovery is likely to occur while making use of low on-resistance which is an advantage of the SJ-MOSFET. The use of the SJ-MOSFET can also reduce the manufacturing cost of the second leg 32 as compared to the case of using the WBG semiconductor.

Moreover, the WBG semiconductor has higher heat resistance than the Si semiconductor and can operate even when the junction temperature is high. Therefore, by using the WBG semiconductor, the first leg 31 and the second leg 32 can be formed by a small chip having a high thermal resistance. In particular, the SiC semiconductor having a low yield at the time of manufacturing a chip can achieve cost reduction when used for a small chip.

Moreover, the WBG semiconductor can prevent an increase in loss generated in the switching element even when driven at a high frequency of about 100 kHz, so that an effect of loss reduction due to downsizing of the reactor 2 increases and that a highly efficient converter can be implemented in a wide output band, that is, under wide load conditions.

Moreover, the WBG semiconductor has higher heat resistance than the Si semiconductor and has a high tolerance level for heat generation associated with switching due to unevenness of loss between the arms, and is thus suitable for the first leg 31 in which switching loss due to high-frequency driving occurs.

As described above, according to the first embodiment, the current detection unit 8 that is the first physical quantity detection unit detects the direct current that is the first physical quantity representing the operating state on the output side of the converter 3, and the current detection unit 6 that is the second physical quantity detection unit detects the power supply current that is the second physical quantity representing the operating state on the input side of the converter 3. The control unit 10 is configured to receive a detected value of a saturated current from at least one of the direct current and the power supply current when the power supply voltage recovers from a state in which the power supply voltage is reduced. This configuration can reliably protect the circuit component from an excessive inrush current that can be generated at the time of recovery from the instantaneous power failure. Note that even if the detected value due to the excessive inrush current at the time of recovery from the instantaneous power failure is saturated, the detected value of the current flowing during normal operation is not saturated. As a result, the resolution for detecting the current flowing during normal operation can be achieved.

Moreover, according to the first embodiment, of the current detection unit 8 as the first physical quantity detection unit and the current detection unit 6 as the second physical quantity detection unit, the detection unit that outputs the detected value of the saturated current to the control unit includes the clamp circuit 23. With this configuration, even in a case where the inrush current preventing circuit 13 does not operate at the time of recovery from the instantaneous power failure, it is possible to reliably and easily detect the period during which the excessive current flows. In addition, since the period during which the excessive current flows can be reliably detected, the synchronous rectification can be performed even when the detected value is saturated due to the excessive current. As a result, the switching elements can be appropriately controlled, and the direct current power supply device and motor drive apparatus having high reliability can be implemented.

Moreover, according to the first embodiment, when the absolute value of the power supply current is greater than or equal to the first current threshold and less than or equal to the second current threshold, the control unit allows the switching element having a smaller loss than the parasitic diode in this range to be turned on. Also, when the absolute value of the power supply current is greater than the second current threshold, the control unit 10 prohibits the switching element having a larger loss than the parasitic diode in this range from being turned on. As a result, in the converter, the current can flow through the element having a small loss according to the current value. This makes it possible to obtain highly efficient direct current power supply device and motor drive apparatus in which a decrease in efficiency and the loss are reduced.

Second Embodiment

Figure 16:
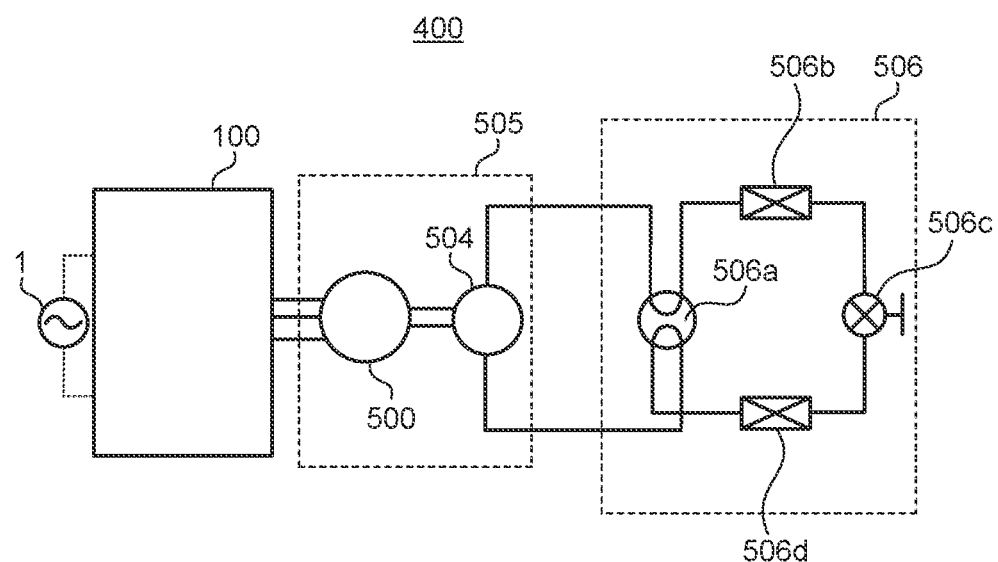
FIG. 16 is a diagram illustrating a configuration of an air conditioner according to a second embodiment.

A second embodiment will describe an example of application of the motor drive apparatus 100 described in the first embodiment. FIG. 16 is a diagram illustrating a configuration of an air conditioner 400 according to the second embodiment. The motor drive apparatus 100 described in the first embodiment can be applied to products such as a blower, a compressor, and an air conditioner. In the second embodiment, an example in which the motor drive apparatus 100 is applied to the air conditioner 400 will be described as an example of application of the motor drive apparatus 100 according to the first embodiment.

In FIG. 16, the motor 500 is connected to an output side of the motor drive apparatus 100, and the motor 500 is coupled to a compression element 504. A compressor 505 includes the motor 500 and the compression element 504. A refrigeration cycle unit 506 includes a four-way valve 506a, an indoor heat exchanger 506b, an expansion valve 506c, and an outdoor heat exchanger 506d.

A passage of the refrigerant circulating in the air conditioner 400 is formed such that it starts from the compression element 504 and returns to the compression element 504 via the four-way valve 506a, the indoor heat exchanger 506b, the expansion valve 506c, and the outdoor heat exchanger 506d, and again via the four-way valve 506a. The motor drive apparatus 100 receives supply of alternating current power from the alternating current power supply 1 and causes the motor 500 to rotate. By the rotation of the motor 500, the compression element 504 can execute a refrigerant compression operation and cause the refrigerant to circulate in the refrigeration cycle unit 506.

Moreover, the air conditioner 400 is predominantly operated under an intermediate condition where the output is half or less of the rated output, that is, a low output condition throughout the year, and thus the operation under the intermediate condition contributes greatly to the annual power consumption. Also, the air conditioner 400 tends to have a low rotational speed of the motor 500 and a low bus voltage required for driving the motor 500. It is thus effective from the viewpoint of system efficiency to operate the switching elements used in the air conditioner 400 in a passive state. Therefore, the motor drive apparatus 100 capable of reducing the loss in a wide range of operation modes from the passive state to the high-frequency switching state is useful for the air conditioner 400. Note that for the motor drive apparatus, a method called an interleaving method different from the method of the first embodiment is also available. Although the interleaving method can downsize the reactor 2, the air conditioner 400 is often operated under the intermediate condition, so that it is not necessary to downsize the reactor 2. On the other hand, from the viewpoint of harmonic suppression and the power factor of the power supply, the method of the first embodiment is more effective. Therefore, the motor drive apparatus 100 according to the first embodiment is particularly useful for an air conditioner.

Moreover, since the motor drive apparatus 100 according to the first embodiment can reduce the switching loss, an increase in temperature of the motor drive apparatus 100 is reduced, and the cooling capacity of a substrate installed in the motor drive apparatus 100 can be ensured even when an outdoor unit blower (not illustrated) is reduced in size. Therefore, the motor drive apparatus 100 according to the first embodiment is highly efficient and suitable for the air conditioner 400 having a high output of 4.0 kW or higher.

Moreover, the use of the motor drive apparatus 100 according to the first embodiment reduces the unevenness of heat generation between the legs. As a result, the reactor 2 can be downsized by high-frequency driving of the switching elements Q1 to Q4, and an increase in weight of the air conditioner 400 can be prevented. Also, the motor drive apparatus 100 according to the first embodiment can reduce the switching loss by the high-frequency driving of the switching elements Q1 to Q4 and implement the air conditioner 400 having a low energy consumption rate and high efficiency.

Note that when the instantaneous power failure occurs in the air conditioner 400, the operation of the converter 3 is stopped first, then the rotation of the motor 500 for driving a compressor is stopped, and finally the rotation of a fan is stopped. In general, the drive energy of the fan is small, and the amount of heat generated by the fan is small. Therefore, the circuit components of the converter 3 and the inverter 18 can be cooled by the wind from the fan by stopping the rotation of the fan at the end. In particular, an increase in temperature of the smoothing capacitor 4, which is a component of the converter 3, causes a decrease in capacity, so that proper cooling at the time of the instantaneous power failure can achieve longer operating life.

Note that the configurations illustrated in the aforementioned embodiments merely illustrate examples of the content of the present invention, and can thus be combined with another known technique or partially omitted and/or modified without departing from the scope of the present invention.

The invention claimed is:
1. A direct current power supply device comprising:
a reactor;
a converter including four unidirectional elements that are bridge-connected, the converter being connected to an alternating current power supply via the reactor, and the converter converting a power supply voltage being an alternating current voltage output from the alternating current power supply into a direct current voltage and applying the direct current voltage to a load;

a smoothing capacitor connected between output terminals of the converter;

an inrush current preventing circuit disposed on a charging path from the alternating current power supply to the smoothing capacitor;

a first physical quantity detection unit detecting a first physical quantity representing an operating state on an output side of the converter;

a second physical quantity detection unit detecting a second physical quantity representing an operating state on an input side of the converter;

a control unit receiving the first and second physical quantities and controlling an operation of the converter; and a control power supply generating an operating voltage for operating the control unit, wherein the first physical quantity detection unit is a current detection unit that detects a direct current flowing through a direct current bus connecting the converter and the load, the current detection unit including a shunt resistor, the control unit receives a saturated physical quantity from at least one of the first and second physical quantity detection units when the power supply voltage recovers from a state in which the power supply voltage is reduced, and a power rating value of the shunt resistor is set to be higher than a power value obtained from a current value flowing at a time of recovery of the power supply voltage and a resistance value of the shunt resistor.

2. The direct current power supply device according to claim 1, wherein of the first and second physical quantity detection units, a detection unit that outputs the saturated physical quantity to the control unit includes a clamp circuit.

3. The direct current power supply device according to claim 1, wherein the second physical quantity detection unit is a current detection unit that detects a power supply current being an alternating current flowing between the alternating current power supply and the converter, or a voltage detection unit that detects the power supply voltage.

4. The direct current power supply device according to claim 1, wherein in the converter, two of the four unidirectional elements are connected in series and form a first leg, and remaining two of the unidirectional elements are connected in series and form a second leg, and a switching element is connected in parallel to at least each of two unidirectional elements in the first and second legs connected to a positive side of the smoothing capacitor, two unidirectional elements in the first and second legs connected to a negative side of the smoothing capacitor, the two unidirectional elements in the first leg, or the two unidirectional elements in the second leg.

5. The direct current power supply device according to claim 4, wherein the switching element is a metal oxide semiconductor field effect transistor formed of a wide band gap semiconductor, the unidirectional element is a parasitic diode of the metal oxide semiconductor field effect transistor, and the control unit causes the metal oxide semiconductor field effect transistor to operate such that a current flows through a channel of the metal oxide semiconductor field effect transistor at a time of recovery of the power supply voltage.

6. The direct current power supply device according to claim 5, wherein the wide band gap semiconductor is silicon carbide, gallium nitride, gallium oxide, or diamond.

7. A motor drive apparatus comprising:

the direct current power supply device according to claim 1; and an inverter that converts an output voltage of the direct current power supply device into an alternating current voltage and applies the alternating current voltage to a motor included in the load.

8. A blower comprising the motor drive apparatus according to claim 7.

9. A compressor comprising the motor drive apparatus according to claim 7.

10. An air conditioner comprising the blower according to claim 8.

11. An air conditioner comprising the compressor according to claim 9.

* * * * *